United States Patent
Koo et al.

(10) Patent No.: US 11,818,895 B2
(45) Date of Patent: Nov. 14, 2023

(54) SEMICONDUCTOR DEVICE INCLUDING FERROELECTRIC LAYER AND METAL PARTICLES EMBEDDED IN METAL-ORGANIC FRAMEWORK LAYER

(71) Applicant: SK hynix Inc., Icheon-si (KR)

(72) Inventors: Won Tae Koo, Icheon-si (KR); Jae Gil Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/581,575

(22) Filed: Jan. 21, 2022

(65) Prior Publication Data

US 2023/0064803 A1   Mar. 2, 2023

(30) Foreign Application Priority Data

Sep. 1, 2021   (KR) .................. 10-2021-0116639

(51) Int. Cl.
| | |
|---|---|
| *H01L 21/00* | (2006.01) |
| *H10B 51/20* | (2023.01) |
| *H01L 29/78* | (2006.01) |
| *H01L 29/792* | (2006.01) |
| *H01L 29/66* | (2006.01) |

(52) U.S. Cl.
CPC ......... *H10B 51/20* (2023.02); *H01L 29/6684* (2013.01); *H01L 29/66833* (2013.01); *H01L 29/78391* (2014.09); *H01L 29/792* (2013.01)

(58) Field of Classification Search
CPC .............. H10B 51/20; H01L 29/78391; H01L 29/66833; H01L 29/6684; H01L 29/792
See application file for complete search history.

(56) References Cited

U.S. PATENT DOCUMENTS

| | | | |
|---|---|---|---|
| 10,593,695 | B1* | 3/2020 | Kim .................. H01L 29/40114 |
| 2014/0231897 | A1* | 8/2014 | Terai ..................... H01L 29/792 257/324 |
| 2015/0179819 | A1* | 6/2015 | Kim .................. H01L 21/02282 438/287 |
| 2016/0308070 | A1 | 10/2016 | Chang et al. |
| 2018/0164244 | A1 | 6/2018 | Oka |
| 2021/0020427 | A1* | 1/2021 | Rozen ............... H01L 21/02181 |

* cited by examiner

*Primary Examiner* — Richard A Booth

(57) ABSTRACT

A semiconductor device includes a substrate, a ferroelectric layer disposed on the substrate in a vertical direction, a charge trap layer disposed on the ferroelectric layer, a gate insulation layer disposed on the charge trap layer, and a gate electrode layer disposed on the gate insulation layer. The charge trap layer includes a metal-organic framework layer and metal particles embedded in the metal-organic framework layer.

20 Claims, 28 Drawing Sheets

SEMICONDUCTOR DEVICE INCLUDING FERROELECTRIC LAYER AND METAL PARTICLES EMBEDDED IN METAL-ORGANIC FRAMEWORK LAYER

CROSS-REFERENCE TO RELATED APPLICATIONS

The present application claims priority under 35 U.S.C. § 119(a) to Korean Application No. 10-2021-0116639, filed on Sep. 1, 2021 in the Korean Intellectual Property Office, which is incorporated herein by reference in its entirety.

BACKGROUND

1. Technical Field

The present disclosure generally relates to a semiconductor device including a ferroelectric layer.

2. Related Art

In general, ferroelectric material may refer to a material having spontaneous electrical polarization in a state in which an external electric field is not applied. In addition, ferroelectric material may exhibit a polarization hysteresis behavior according to an externally applied electric field. Accordingly, it is possible to reversibly have one of two stable remanent polarization states on the polarization hysteresis curve by controlling the applied electric field. This feature may be applied to non-volatile storage of signal information of "0" and "1".

Recently, research on a field effect transistor type nonvolatile memory device in which ferroelectric material is used in a gate dielectric layer is being conducted. A write operation to the nonvolatile memory device may be performed by providing a write voltage to the nonvolatile memory device to write different remanent polarization states to the gate dielectric layer as logic information. A read operation of the nonvolatile memory device may take advantage of changes in the resistance of a channel layer of the field effect transistor according to the orientation and size of the remanent polarization written in the gate dielectric layer. That is, a read operation of a nonvolatile memory device may be performed by providing a read voltage to the nonvolatile memory device to read a channel current of a field effect transistor that includes ferroelectric material.

SUMMARY

A semiconductor device according to an embodiment of the present disclosure may include a substrate, a ferroelectric layer disposed on the substrate, a charge trap layer disposed on the ferroelectric layer, a gate insulation layer disposed on the charge trap layer, and a gate electrode layer disposed on the gate insulation layer. The charge trap layer may include a metal-organic framework layer and metal particles embedded in the metal-organic framework layer.

A semiconductor device according to another embodiment of the present disclosure may include a substrate, a channel layer disposed on the substrate, a ferroelectric layer disposed on the channel layer, a charge trap layer disposed on the ferroelectric layer, a gate insulation layer disposed on the charge trap layer, a gate electrode layer disposed on the gate insulation layer, and a source electrode layer and a drain electrode layer disposed to respectively contact opposite ends of the channel layer over the substrate. The charge trap layer may include a metal-organic framework layer and metal particles embedded in the metal-organic framework layer.

In a method of manufacturing a semiconductor device according to another embodiment of the present disclosure, a substrate may be provided. A ferroelectric layer may be formed on the substrate. Two-dimensional conductive metal-organic frameworks that include cavities may be stacked on the ferroelectric layer to form a metal-organic framework layer. In this case, the cavities of the conductive metal-organic frameworks may be disposed to overlap with each other in a thickness direction of the metal-organic framework layer. Metal particles may be disposed within the overlapping cavities to form a charge trap layer. A gate insulation layer may be formed on the charge trap layer. A gate electrode layer may be formed on the gate insulation layer.

A semiconductor device according to yet another embodiment of the present disclosure may include a substrate, a gate structure including a hole pattern over the substrate, the gate structure including gate electrode layers and interlayer insulation layers, which are alternately stacked over the substrate, a gate insulation layer disposed on a sidewall surface of the gate structure exposed by the hole pattern, a charge trap layer disposed on a sidewall surface of the gate insulation layer, a ferroelectric layer disposed on a sidewall surface of the charge trap layer, and a channel layer disposed on a sidewall surface of the ferroelectric layer. The charge trap layer may include a metal-organic framework layer and metal particles embedded in the metal-organic framework layer.

DETAILED DESCRIPTION

Figure 1:
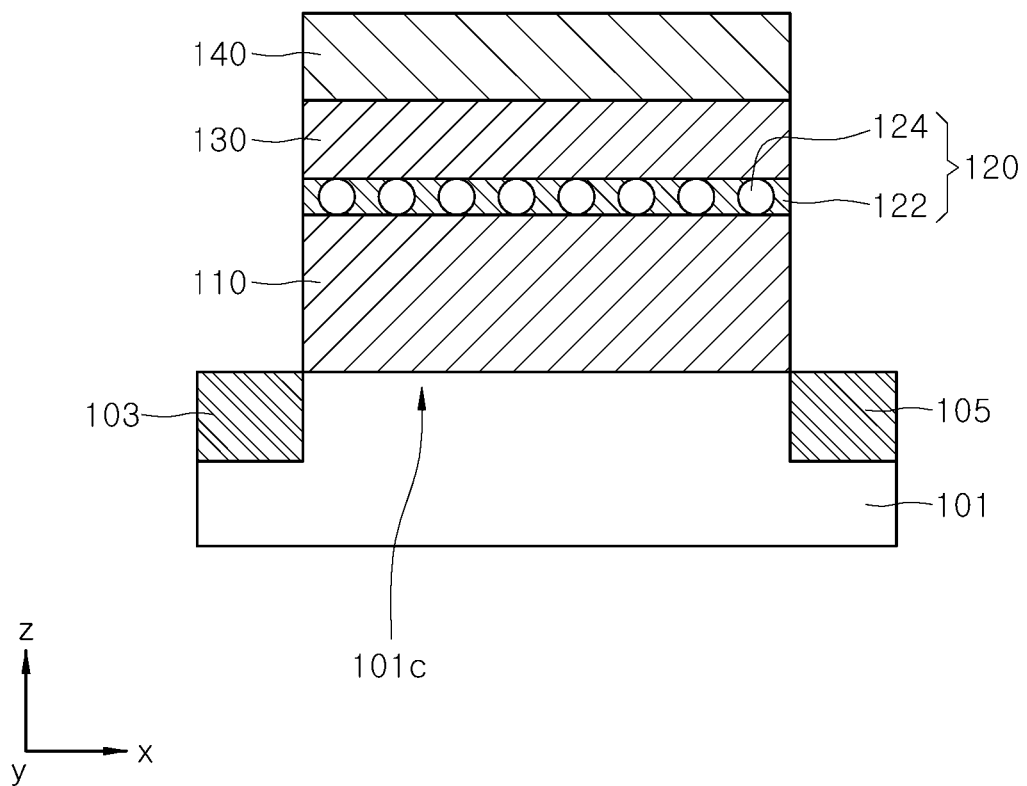
FIG. 1 is a schematic cross-sectional view illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as the stated order, and may be performed substantially at the same time. Also, at least a part of each of the above processes may be performed in a reversed order.

Embodiments of the present disclosure provide semiconductor devices including a charge trap layer disposed between a ferroelectric layer and a gate insulation layer. The charge trap layer includes a metal-organic framework layer and metal particles embedded in the metal-organic framework layer. The metal-organic framework layer may prevent a depolarization electric field from being formed inside the ferroelectric layer, and the metal particles may increase the operation voltage range (i.e., a memory operation window) of the semiconductor device through an operation of trapping or de-trapping electrons. In addition, the charge trap layer may improve the durability and polarization retention of the semiconductor device.

Figure 2A:
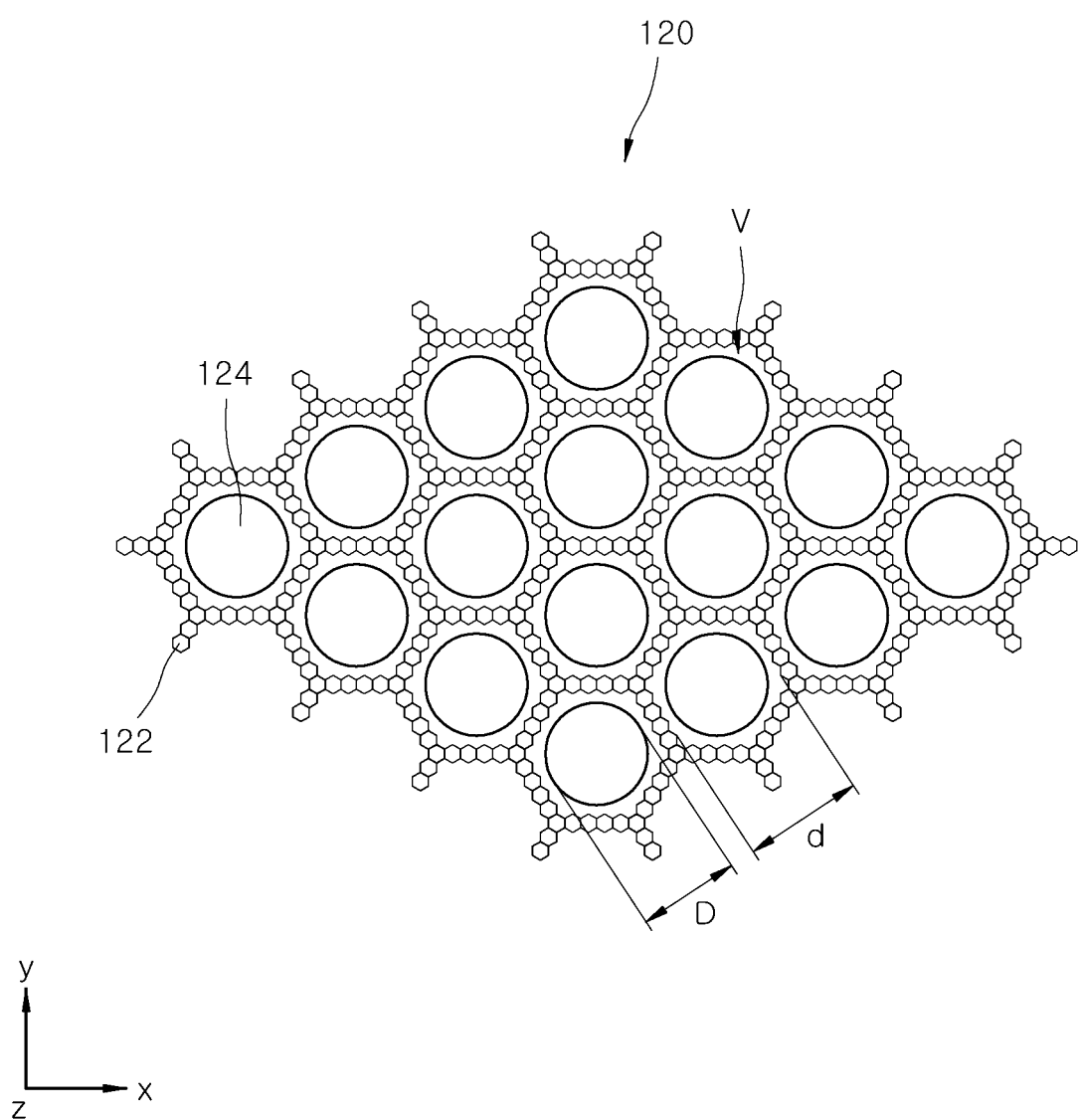
FIG. 2A is a schematic plan view illustrating a charge trap layer of a semiconductor device according to an embodiment of the present disclosure.
Figure 2B:
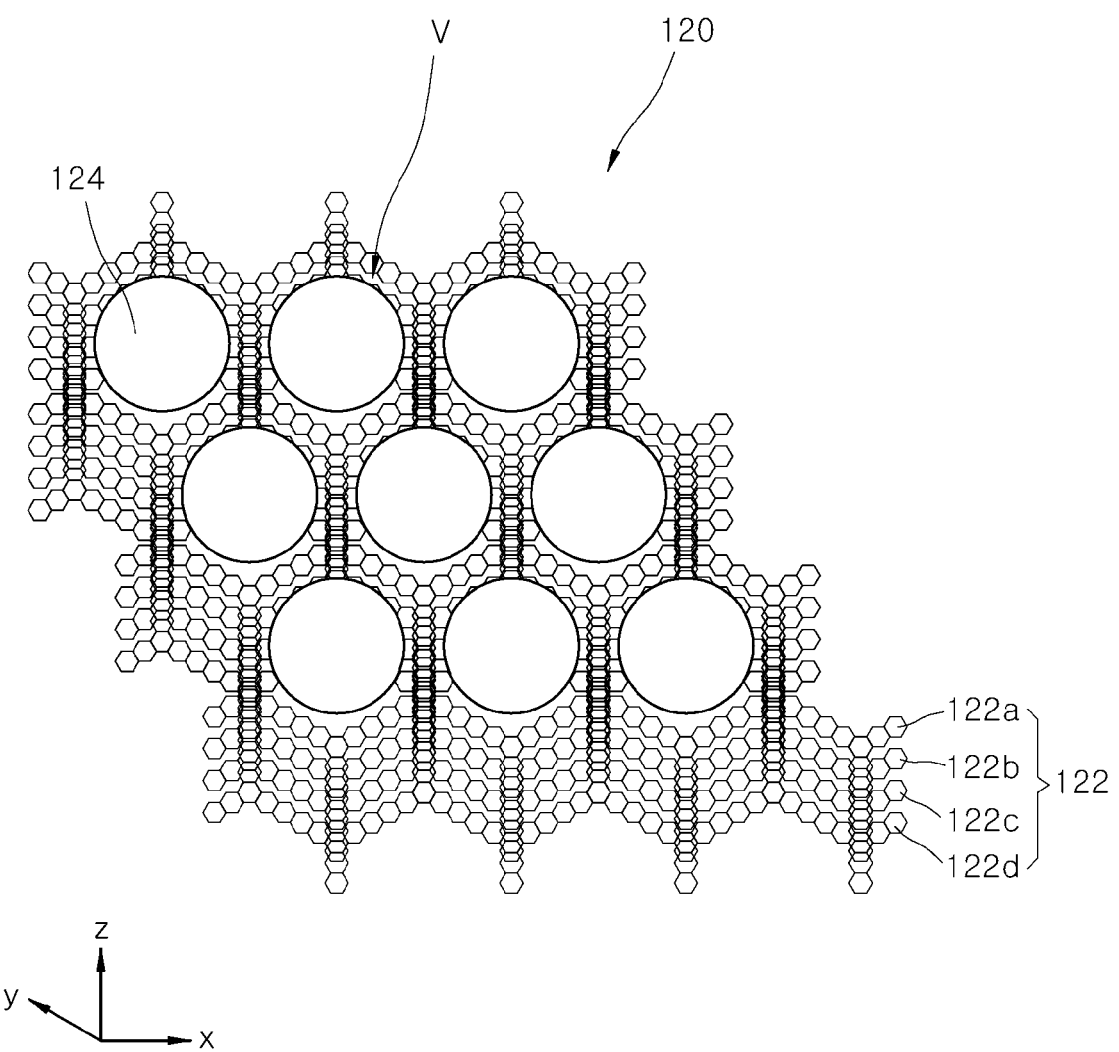
FIG. 2B is a schematic perspective view illustrating a charge trap layer of a semiconductor device according to an embodiment of the present disclosure.
Figure 3A:
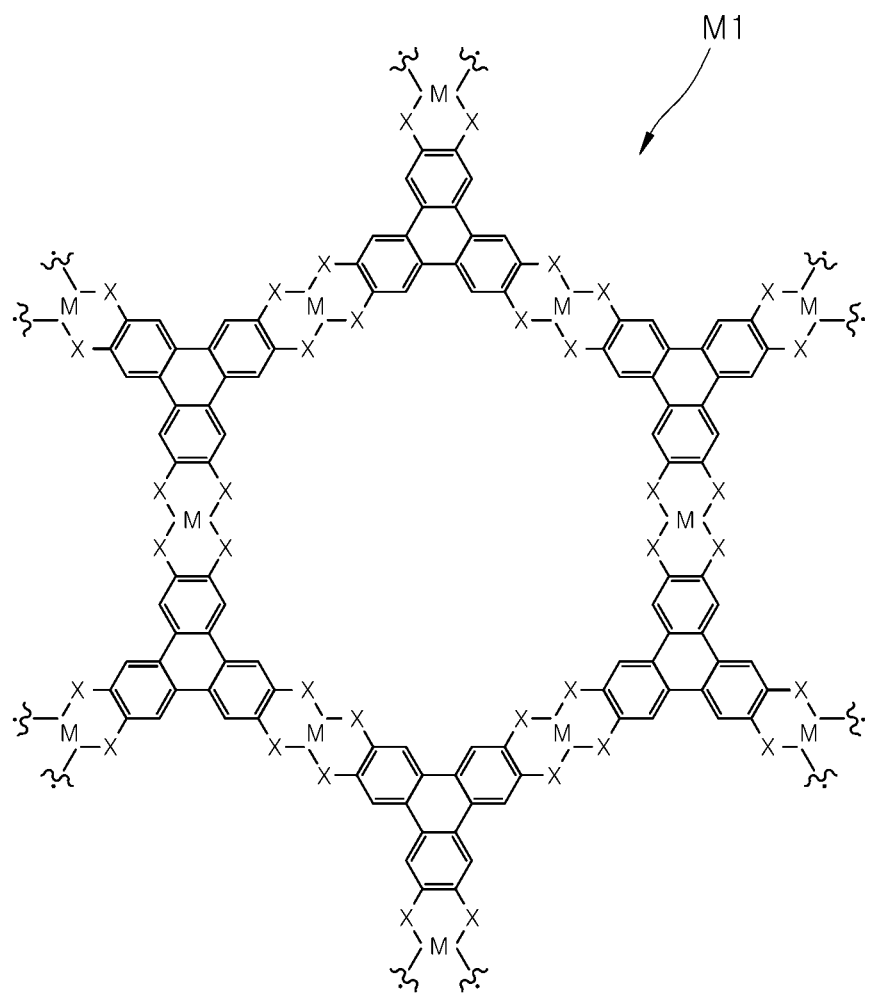
FIGS. 3A and 3B are schematic views illustrating a conductive metal-organic framework of a semiconductor device according to an embodiment of the present disclosure.
Figure 3B:
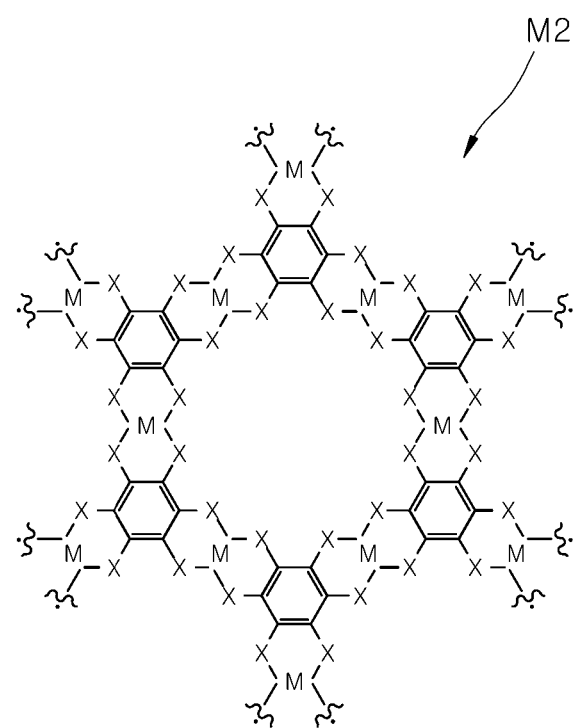

FIG. 1 is a schematic cross-sectional view illustrating a semiconductor device according to an embodiment of the present disclosure. FIG. 2A is a schematic plan view illustrating a charge trap layer of the semiconductor device according to an embodiment of the present disclosure. FIG. 2B is a schematic perspective view illustrating a charge trap layer of a semiconductor device according to an embodiment of the present disclosure. FIGS. 3A and 3B are schematic views illustrating a conductive metal-organic framework of a semiconductor device according to an embodiment of the present disclosure.

Referring to FIG. 1, a semiconductor device 1 may include a substrate 101, a ferroelectric layer 110 disposed on the substrate 101, a charge trap layer 120 disposed on the ferroelectric layer 110, a gate insulation layer 130 disposed on the charge trap layer 120, and a gate electrode layer 140 disposed on the gate insulation layer 130. In addition, the semiconductor device 1 may further include a source region 103 and a drain region 105, which are disposed in regions of the substrate 101 opposite to each other with respect to the gate electrode layer 140.

The substrate 101 may include a semiconductor material. As an example, the semiconductor material may include silicon (Si), germanium (Ge), gallium arsenide (GaAs), or the like. The substrate 101 may be doped with an N-type or P-type dopant to have electrical conductivity.

The source region 103 and the drain region 105 may be disposed to be spaced apart from each other. Each of the source region 103 and the drain region 105 may be a region of the substrate 101 doped with a dopant. The doping type of the source region 103 and drain region 105 may be different from that of the substrate 101. For example, when the substrate 101 is doped with a P-type dopant, the source region 103 and the drain region 105 may be doped with an N-type dopant. In another example, when the substrate 101 is doped with an N-type dopant, the source region 103 and the drain region 105 may be doped with a P-type dopant.

A channel region 101c may be disposed in the substrate 101 between the source region 103 and the drain region 105. The channel region 101c may be located directly below the ferroelectric layer 110. A conductive channel that electrically connects the source region 103 and the drain region 105 to each other may be formed in the channel region 101c, depending on a voltage applied to the gate electrode layer 140.

The ferroelectric layer 110 may be disposed on the substrate 101. The ferroelectric layer 110 may include a ferroelectric material. The ferroelectric material may have spontaneous electrical polarization. The ferroelectric material may exhibit a hysteresis behavior with respect to polarization according to a write voltage applied between the gate electrode layer 140 and the substrate 101. In an example, the ferroelectric material may have predetermined polarization determined from a polarization hysteresis curve in response to the write voltage. After the write voltage is removed, the ferroelectric material may maintain the remanent polarization corresponding to the predetermined polarization. The remanent polarization may function as signal information in the semiconductor device 1 and may be non-volatilely stored in the ferroelectric layer 110. That is, the ferroelectric layer 110 may function as a memory layer of the semiconductor device 1.

In an embodiment, the ferroelectric layer 110 may include metal oxide having a crystalline structure of an orthorhombic system as a ferroelectric material. The metal oxide may include, for example, hafnium oxide, zirconium oxide, hafnium zirconium oxide, or a combination of two or more thereof. In an embodiment, the ferroelectric layer 110 may include a dopant doped into the ferroelectric material. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), lanthanum (La), or a combination thereof. In an embodiment, the dopant may be distributed in the crystal lattice so that the ferroelectric layer 110 maintains an orthorhombic crystal structure, thereby stabilizing the ferroelectric characteristics of the ferroelectric layer 110.

Referring to FIG. 1, the charge trap layer 120 may be disposed on the ferroelectric layer 110. The charge trap layer 120 may include a metal-organic framework layer 122 and metal particles 124 embedded in the metal-organic framework layer 122. As illustrated in FIG. 1, a diameter of the metal particle 124 may be substantially the same as a thickness of the metal-organic framework layer 122. That is, a metal particle 124 may penetrate or extend through the metal-organic framework layer 122 to contact the ferroelectric layer 110 and the gate insulation layer 130. As will be described later, the metal-organic framework layer 122 may prevent a depolarization electric field from being formed inside the ferroelectric layer 110 because the metal-organic framework layer 122 has an electrically conductive property, and because the metal particles 124 may increase the operation voltage range (i.e., the memory operation window) of the semiconductor device 1 through an operation of trapping or de-trapping electrons. In addition, as will be described later, the charge trap layer 120 may improve the durability and polarization retention of the semiconductor device 1.

The metal-organic framework layer 122 may include at least two conductive metal-organic frameworks. Referring to FIGS. 2A and 2B, in an embodiment, the metal-organic framework layer 122 includes at least four conductive metal-organic frameworks 122a, 122b, 122c, and 122d stacked or layered on the ferroelectric layer 110 of FIG. 1. The at least four conductive metal-organic frameworks 122a, 122b, 122c, and 122d may be disposed that cavities of the at least four conductive metal-organic frameworks 122a, 122b, 122c, and 122d are overlapped with each other in a thickness direction (that is, z-direction) of the metal-organic framework layer 122, as shown FIG. 2B. The metal-organic framework layer 122 may have electrically conductive properties. Although the first to fourth conductive metal-organic frameworks 122a, 122b, 122c, and 122d are illustrated in FIG. 2B, embodiments of the present disclosure is not necessarily limited thereto.

Each of the first to fourth conductive metal-organic frameworks 122a, 122b, 122c, and 122d may have a coordination bond between a metal node and an organic ligand, and may include cavities V disposed at a regularly spaced interval. Each of the first to fourth conductive metal-organic frameworks 122a, 122b, 122c, and 122d may have a two-dimensional (2D) structure. Here, the two-dimensional structure may mean a sheet-shaped structure disposed on a two-dimensional plane as illustrated in FIG. 2A. For example, the conductive metal-organic frameworks may be arranged in a 2D hexagonal lattice-like structure that forms cavities V at a regular spacing or intervals. A shortest width d of the cavity V may have a size of, for example, 1 nanometer (nm) to 10 nm. The first to fourth conductive metal-organic frameworks 122a, 122b, 122c, and 122d may be made of the same material. Each of the first to fourth conductive metal-organic frameworks 122a, 122b, 122c, and 122d may have conductivity through bonding between a metal node and an organic ligand, as described below. For example, the conductivity in a conductive metal-organic framework may be obtained through bonding between the d-orbital of the metal constituting the metal node and the p-orbital of the organic ligand.

Referring to FIG. 2B, in the metal-organic framework layer 122, the cavities V of the first to fourth conductive metal-organic frameworks 122a, 122b, 122c, and 122d may be disposed to overlap or substantially overlap with each other in the z-direction. The metal particles 124 may be disposed within the overlapping cavities V.

Each of the metal particles 124 may have a form in which metal atoms are aggregated. In FIGS. 1, 2A, and 2B, each of the metal particles 124 is illustrated in a spherical shape, but the present disclosure is not limited thereto, and other three-dimensional shapes are possible.

In an embodiment, a diameter D of the metal particle 124 having a spherical shape may have a size of, for example, 1 nm to 10 nm, however, the diameter D of the metal particle 124 may be smaller than the shortest width d of the cavity V. Accordingly, the metal particles 124 may be disposed inside the cavities V, and may be regularly arranged in the metal-organic framework layer 122. The metal particle 124 may include, for example, cobalt (Co), nickel (Ni), copper (Cu), iron (Fe), platinum (Pt), gold (Au), silver (Ag), iridium (Ir), ruthenium (Ru), palladium (Pd), manganese (Mg), or a combination of two or more thereof.

FIGS. 3A and 3B illustrate a structural formula of a conductive metal-organic framework according to an embodiment of the present disclosure. Referring to FIG. 3A, a conductive metal-organic framework M1 may be $M_3(HXTP)_2$ (M is metal, X is oxygen (O), sulfur (S), or nitrogen (N)). As an example, when M is cobalt (Co), nickel (Ni), or copper (Cu) and X is oxygen (O), the conductive metal-organic framework M1 may be $Co_3(HHTP)_2$, $Ni_3(HHTP)_2$, or $Cu_3(HHTP)_2$, respectively. Here, the metal constituting the metal node is cobalt (Co), nickel (Ni), or copper (Cu), and the organic ligand HHTP may be hexahydroxytriphenylene. As another example, when M is iron (Fe), cobalt (Co), or platinum (Pt) and X is sulfur (S), the conductive metal-organic framework M1 may be $Fe_3(HTTP)_2$, $Co_3(HTTP)_2$, or $Pt_3(HTTP)_2$, respectively. In this case, the metal constituting the metal node is Fe, Co, or Pt, and the organic ligand HTTP may be hexathioltriphenylene. As further another example, when M is cobalt (Co), nickel (Ni), or copper (Cu) and X is nitrogen (N), the conductive metal-organic framework M1 may be $Co_3(HITP)_2$, $Ni_3(HITP)_2$, or $Cu_3(HITP)_2$, respectively. In this case, the metal constituting the metal node is cobalt (Co), nickel (Ni), or copper (Cu), and the organic ligand HTTP may be hexaiminotriphenylene.

Referring to FIG. 3B, a conductive metal-organic framework M2 may be $M_3(HXB)_2$ (M is metal, and X is oxygen (O), sulfur (S), or nitrogen (N)). As an example, when M is copper (Cu) and X is oxygen (O), the conductive metal-organic framework M2 may be $Cu_3(HHP)_2$. In this case, the metal constituting the metal node is copper (Cu), and the organic ligand HHP may be hexahydrobenzene. As another example, when M is nickel (Ni) or palladium (Pd) and X is sulfur (S), the conductive metal-organic framework M2 may be $Ni_3(HTP)_2$ or $Pd_3(HTP)_2$, respectively. In this case, the metal constituting the metal node is nickel (Ni) or palladium (Pd), and the organic ligand HTP may be hexathiolbenzene. As further another example, when M is manganese (Mn), iron (Fe), cobalt (Co), nickel (Ni), or copper (Cu) and X is nitrogen (N), the conductive metal-organic framework M2 may be $Mn_3(HAP)_2$, $Fe_3(HAP)_2$, $Co_3(HAP)_2$, $Ni_3(HAP)_2$, or $Cu_3(HAP)_2$, respectively. In this case, the metal constituting the metal node is manganese (Mn), iron (Fe), nickel (Ni), or copper (Cu), and the organic ligand HAP may be hexaaminobenzene.

Referring back to FIG. 1, the gate insulation layer 130 may be disposed on the charge trap layer 120. The gate insulation layer 130 may have no ferroelectric properties, i.e., the gate insulation layer 130 may be non-ferroelectric. The lack of ferroelectricity may include paraelectricity or antiferroelectricity. The gate insulation layer 130 may include, for example, oxide, nitride, oxynitride, or a combination of two or more thereof. In an embodiment, the gate insulation layer 130 may be a silicon oxide layer, a silicon nitride layer, a silicon oxynitride layer, or an aluminum oxide layer.

The gate electrode layer 140 may be disposed on the gate insulation layer 130. The gate electrode layer 140 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In some embodiments, an interfacial insulation layer may be additionally disposed between the substrate 101 and the ferroelectric layer 110. The interfacial insulation layer may function as a buffer layer for alleviating a lattice constant difference between the substrate 101 and the ferroelectric layer 110.

As described above, the semiconductor device 1 according to an embodiment of the present disclosure may be a memory device in the form of a field effect transistor including the ferroelectric layer 110. The semiconductor device 1 may include the charge trap layer 120 disposed between the ferroelectric layer 110 and the gate insulation layer 130. The charge trap layer 120 may include the metal-organic framework layer 122 and the metal particles 124 embedded in the metal-organic framework layer 122. As will be described later, the metal-organic framework layer 122 may prevent a depolarization electric field from being formed inside the ferroelectric layer 110, and the metal particles 124 may increase the operation voltage range of the semiconductor device 1, that is, the memory operation window, through an operation of trapping or de-trapping charges. In addition, as will be described later, the charge trap layer 120 may improve the durability and polarization retention of the semiconductor device 1.

FIGS. 4A to 4D are views schematically illustrating an operation of a semiconductor device according to an embodiment of the present disclosure. FIG. 5A is a graph schematically illustrating a hysteresis operation performed by a ferroelectric layer of a semiconductor device according to an embodiment of the present disclosure. FIG. 5B is a schematic graph illustrating a memory window characteristic of a semiconductor device according to an embodiment of the present disclosure. FIG. 5C is a schematic graph illustrating a threshold voltage characteristic of a semiconductor device according to an embodiment of the present disclosure.

The operation of a semiconductor device associated with FIGS. 4A to 4D and FIGS. 5A to 5C may be described using a semiconductor device 1 described above with reference to FIG. 1.

Figure 4A:
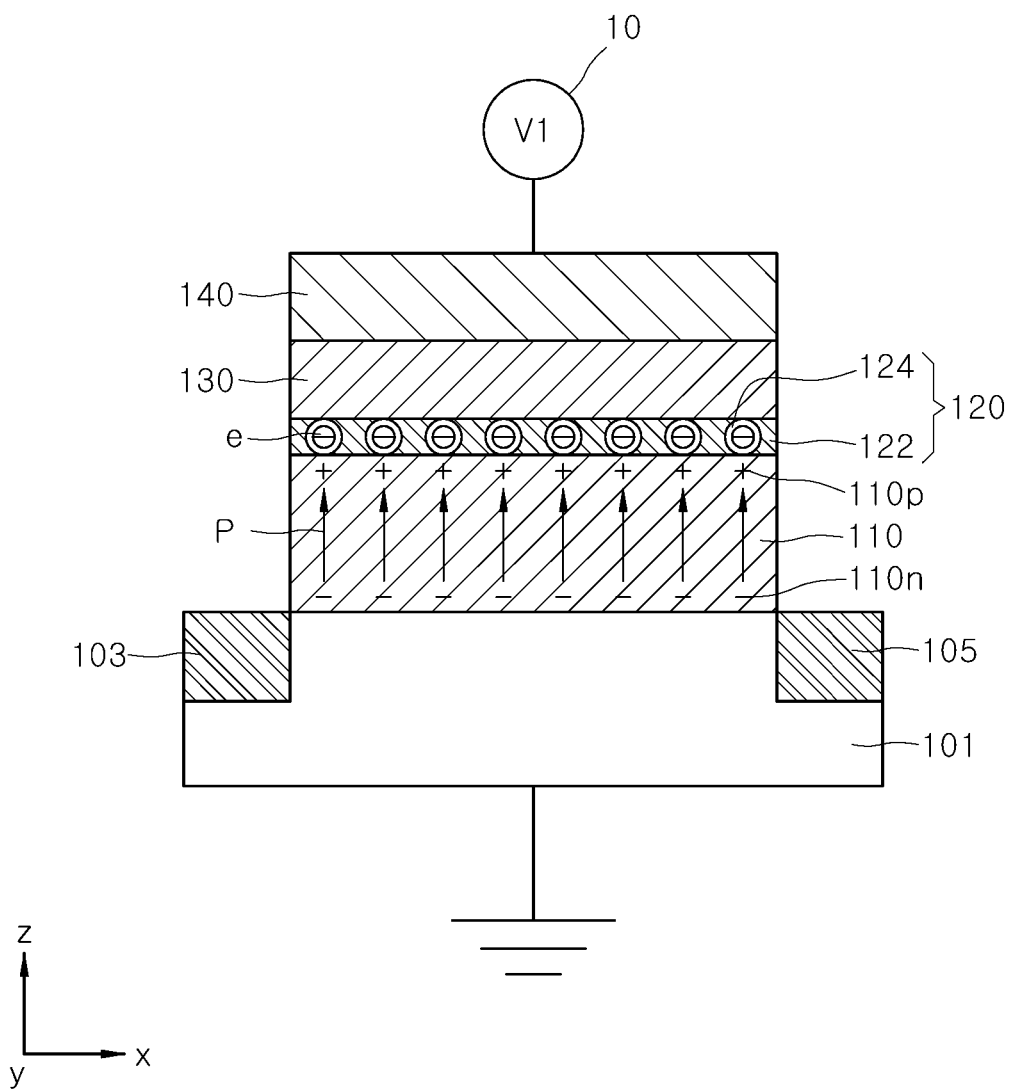
FIGS. 4A to 4D are views schematically illustrating an operation of a semiconductor device according to an embodiment of the present disclosure.
Figure 5A:
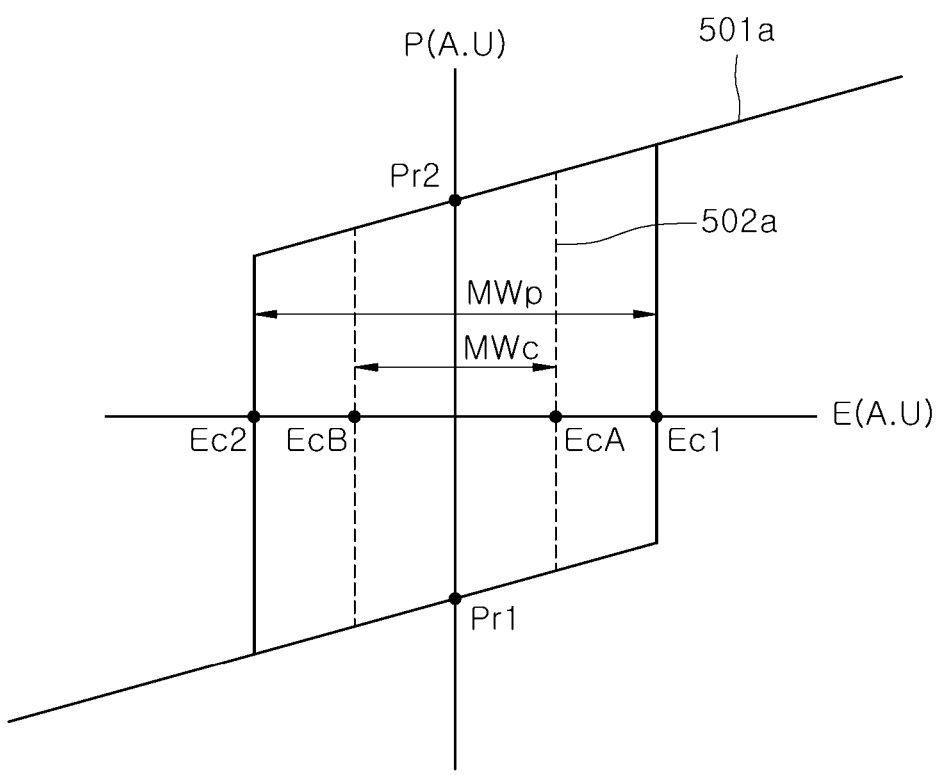
FIG. 5A is a graph schematically illustrating a hysteresis operation performed by a ferroelectric layer of a semiconductor device according to an embodiment of the present disclosure.
Figure 5B:
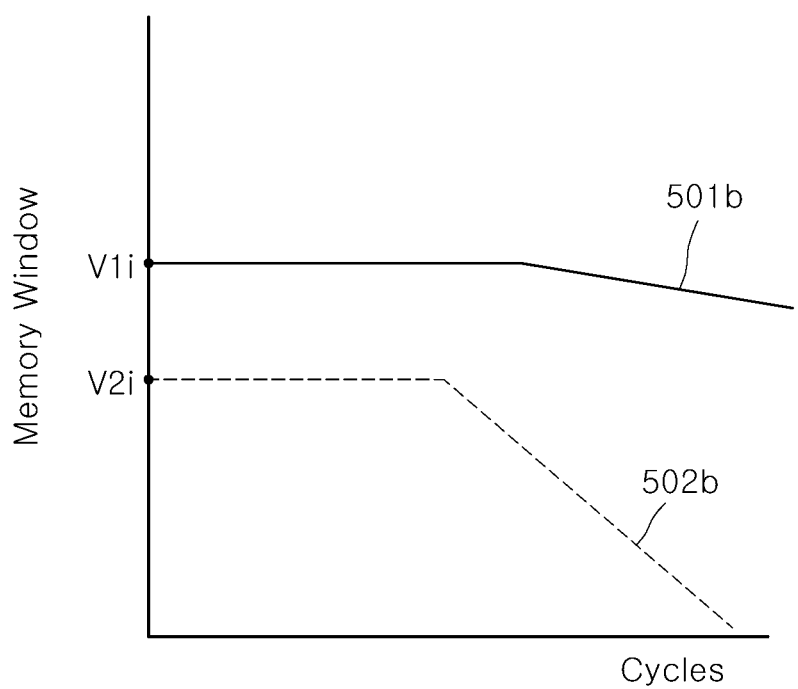
FIG. 5B is a schematic graph illustrating a memory window characteristic of a semiconductor device according to an embodiment of the present disclosure.
Figure 5C:
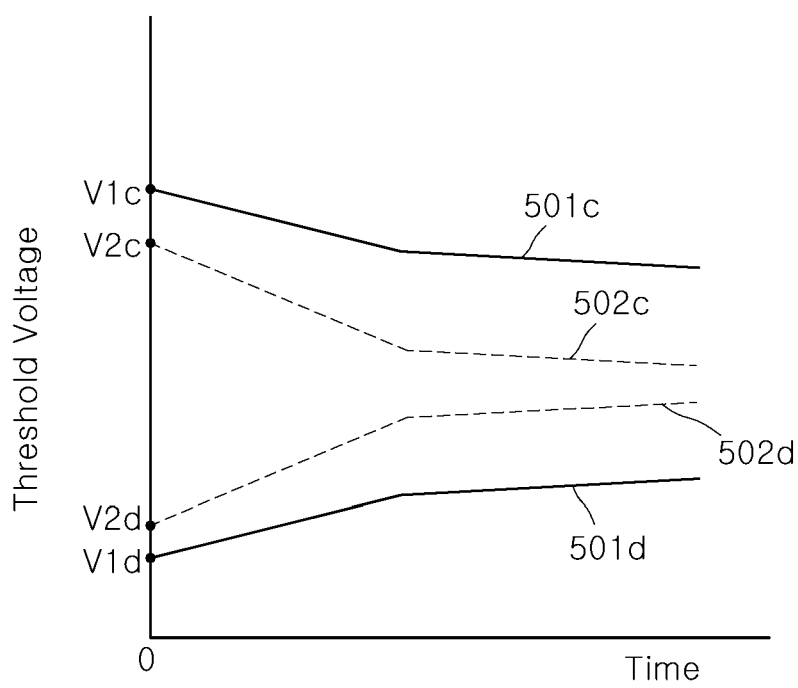
FIG. 5C is a schematic graph illustrating a threshold voltage characteristic of a semiconductor device according to an embodiment of the present disclosure.

Referring to FIG. 4A, a first write operation may be performed with respect to the semiconductor device 1. Specifically, the first write operation may be performed by applying a first write voltage V1 between the substrate 101 and the gate electrode layer 140 using a power supply 10. The substrate 101 may have conductivity by including a doped semiconductor material.

The method of applying the first write voltage V1 may include applying a bias having a negative polarity to the gate electrode layer 140 while the substrate 101 is grounded. Accordingly, polarization P inside the ferroelectric layer 110 may be aligned in one direction, along an electric field formed by the first write voltage V1. The polarization P inside the ferroelectric layer 110 may have a polarization oriented from the substrate 101 toward the gate electrode layer 140. In addition, during the first write operation, electrons e that are injected from the gate electrode layer 140 and that move towards the ferroelectric layer 110 may be trapped in the metal particles 124 of the charge trap layer 120. Subsequently, after the first write operation is completed, the applied first write voltage V1 may be removed from the semiconductor device 1.

Compared to a semiconductor device without a charge trap layer 120, in embodiments of the present disclosure, which include the charge trap layer 120, the first write voltage V1 applied to a semiconductor device 1 to perform the first write operation may be greater in magnitude. For example, when the first write operation is performed on a semiconductor device 1, the level of the first write voltage V1 may increase to perform an additional operation of trapping electrons e in the metal particles 124 of the charge trap layer 120.

Figure 4B:
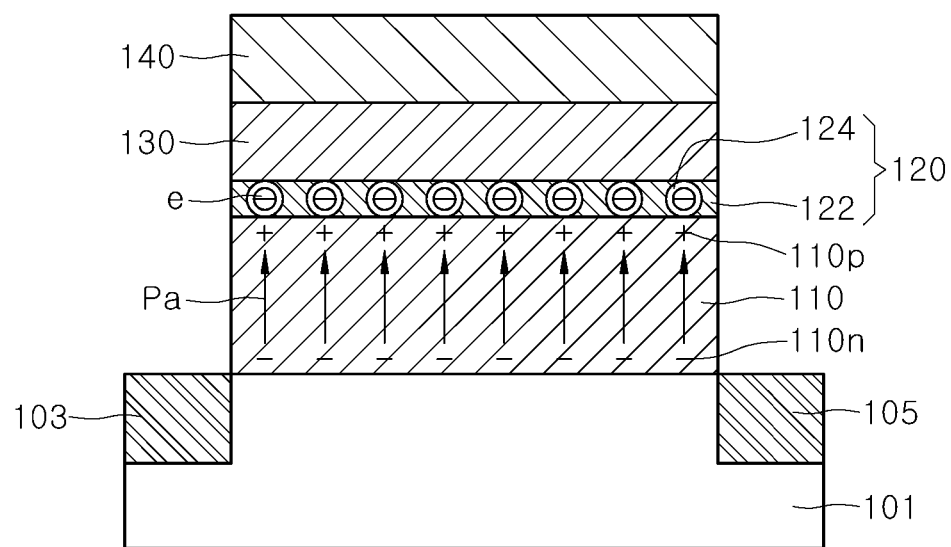

Referring to FIG. 4B, after the first write voltage V1 is removed, first remanent polarization Pa may be aligned inside the ferroelectric layer 110. The first remanent polarization Pa may have substantially the same polarization orientation as the polarization P that resulted from application of the first write voltage V1. Due to the first remanent polarization Pa, negative charges 110n may be distributed in an inner region of the ferroelectric layer 110 adjacent to the substrate 101, and positive charges 110p may be distributed in an inner region of the ferroelectric layer 110 adjacent to the charge trap layer 120.

The substrate 101, which includes a semiconductor material, may have enough holes to screen the adjacent negative charges 110n of the ferroelectric layer 110. In addition, the charge trap layer 120, which includes the metal-organic framework layer 122, may have enough electrons to screen the adjacent positive charges 110p of the ferroelectric layer 110. Accordingly, in an embodiment of the present disclosure, it is possible to suppress the generation of a depolarization electric field that may weaken the first remanent polarization Pa in the ferroelectric layer 110. In general, the depolarization electric field may be generated inside a ferroelectric layer when the ferroelectric layer and a thin film contact each other, but the thin film does not sufficiently screen the negative or positive charges generated by the polarization alignment of the ferroelectric layer. In an embodiment of the present disclosure, the reliability of the remanent polarization stored in the ferroelectric layer 110 may be improved as the generation of the depolarization electric field is suppressed.

On the other hand, when the charge trap layer 120 is not included in the semiconductor device, the gate insulation layer 130 may be in direct contact with the ferroelectric layer 110. Because the gate insulation layer 130 includes an insulating material, the gate insulation layer 130 may not have a sufficient quantity of electrons to screen the positive charges 110p of the ferroelectric layer 110. Accordingly, the depolarization electric field that weakens a first remanent polarization Pa of the ferroelectric layer 110 may be generated inside the ferroelectric layer 110. As described above, the depolarization electric field may result in the deterioration of the signal information storage capability of the ferroelectric layer 110.

Figure 4C:
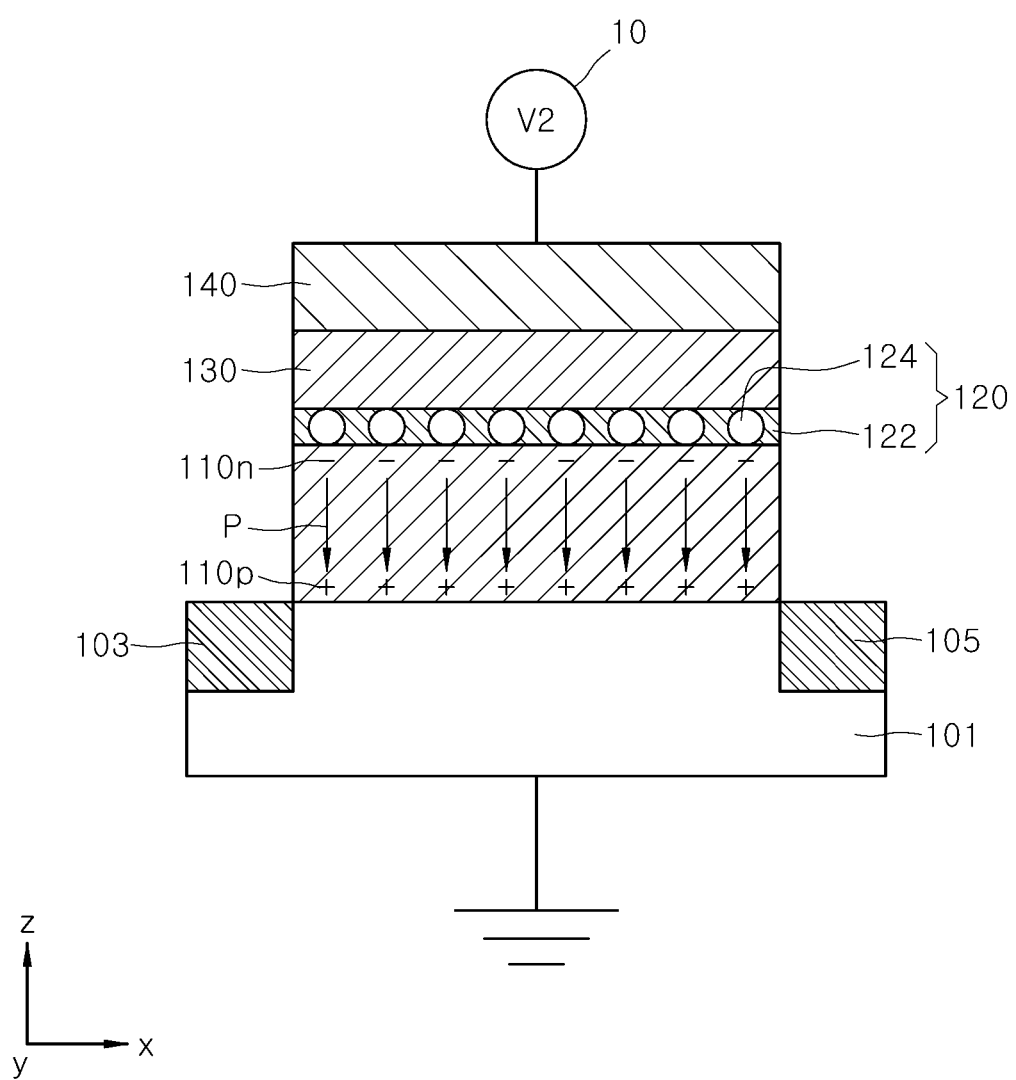

Referring to FIG. 4C, a second write operation may be performed with respect to the semiconductor device 1 in which the first remanent polarization Pa of FIG. 4B is stored. The second write operation may be performed by applying a second write voltage V2 between the substrate 101 and the gate electrode layer 140 of the semiconductor device 1 using the power supply 10. The method of applying the second write voltage V2 may be performed by applying a bias having a positive polarity to the gate electrode layer 140 while the substrate 101 is grounded. Accordingly, the polarization P inside the ferroelectric layer 110 may be switched and aligned in one direction along to the electric field formed by the second write voltage V2. The polarization P may have a polarization that is oriented from the gate electrode layer 140 towards the substrate 101. In addition, during the second write operation, the electrons e trapped in the metal particles 124 of the charge trap layer 120 may escape from the metal particles 124 and move to the gate electrode layer 140. Subsequently, after the second write operation is completed, the applied second write voltage V2 may be removed from the semiconductor device 1.

When the second write voltage V2 is applied to switch the polarization P inside the ferroelectric layer 110, the applied second write voltage V2 needs to overcome a potential formed by the electrons e trapped in the metal particles 124 of the charge trap layer 120. Accordingly, compared to a case in which the charge trap layer 120 is not included in the semiconductor device 1, in the present embodiment in which the charge trap layer 120 is included in the semiconductor device, a level of the second write voltage V2 applied to the semiconductor device 1 to perform the second write operation may be relatively increased.

Figure 4D:
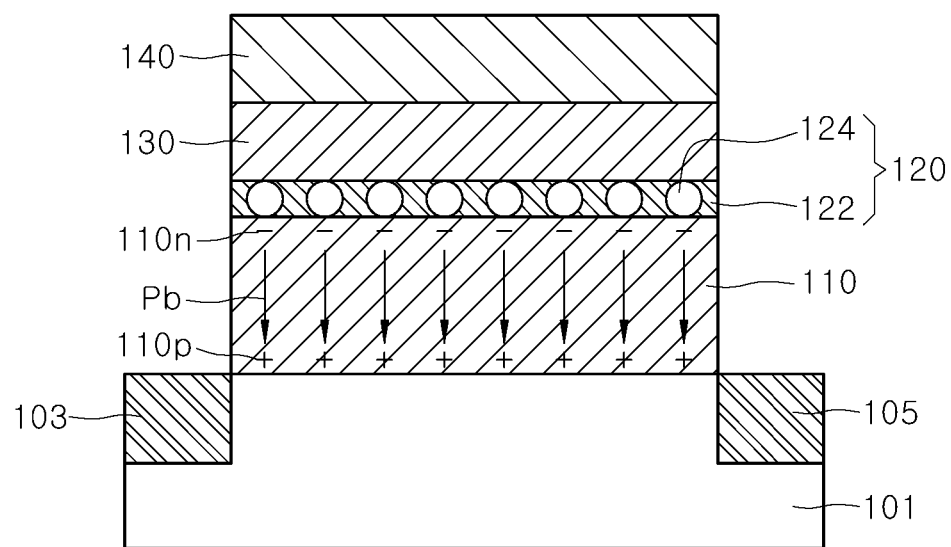

Referring to FIG. 4D, after the second write voltage V2 is removed, second remanent polarization Pb may be aligned inside the ferroelectric layer 110. The second remanent polarization Pb may have substantially the same polarization orientation as the polarization P generated by application of the second write voltage V2. Due to the second remanent polarization Pb, positive charges 110p may be distributed in the inner region of the ferroelectric layer 110 adjacent to the substrate 101, and negative charges 110n may be distributed in the inner region of the ferroelectric layer 110 adjacent to the charge trap layer 120.

The substrate 101 may be doped with a dopant and may have a sufficient amount of electrons to screen the positive charges 110p of the ferroelectric layer 110. In addition, the charge trap layer 120, including the metal-organic framework layer 122, may have a sufficient amount of holes to screen the negative charges 110n of the ferroelectric layer 110. Accordingly, generation of a depolarization electric field that weakens the second remanent polarization Pb inside the ferroelectric layer 110 may be suppressed. As a result, the reliability and stability of the remanent polarization stored in the ferroelectric layer 110 may be improved.

FIG. 5A illustrates a first hysteresis graph 501a and a second hysteresis graph 502a of a semiconductor device. The first hysteresis graph 501a may be a graph that characterizes a semiconductor device 1 including a charge trap layer 120 according to an embodiment of the present disclosure. The second hysteresis graph 502a may be a graph that characterizes a semiconductor device in a comparative example in which the charge trap layer 120 is omitted from a semiconductor device.

The first hysteresis graph 501a may include first and second remanent polarization Pr1 and Pr2 and first and second coercive fields Ec1 and Ec2. The second hysteresis graph 502a may include first and second remanent polarization Pr1 and Pr2 and third and fourth coercive fields EcA and EcB. The first remanent polarization Pr1 may correspond to the first remanent polarization Pa of FIG. 4B, and the second remanent polarization Pr2 may correspond to the second remanent polarization Pb of FIG. 4D.

Compared to the second hysteresis graph 502a, the first hysteresis graph 501a may have a larger memory operation window, which is proportional to the width between a pair of coercive fields. For example, a first memory operation window MWp of the first hysteresis graph 501a may be larger than a second memory operation window MWc of the second hysteresis graph 502a. The increase in the size of the memory operation window may result from an increase in the level of the first write voltage V1 to additionally perform an operation of trapping electrons e in the metal particles 124 of the charge trap layer 120 when the first write operation is in progress. In addition, the increase in the size of the memory operation window may be due to the increase in the level of the second write voltage V2 required to overcome the potential formed by the electrons e trapped in the metal particles 124 of the charge trap layer 120 when the second write operation is in progress. As a result, in the case of the first hysteresis graph 501a, the operation voltage range of the semiconductor device, that is, the memory operation window, may increase as compared to the second hysteresis graph 502a. Accordingly, as the memory operation window increases, in a semiconductor device storing multi-level remanent polarization as signal information, the voltage interval between a plurality of write voltages may be increased. As a result, the operational reliability of the memory in the semiconductor device may be improved.

FIG. 5B illustrates a first memory window graph 501b and a second memory window graph 502b of a semiconductor device. The first memory window graph 501b may be a graph characterizing the semiconductor device 1, including the charge trap layer 120, according to an embodiment of the disclosure. The second memory window graph 502b may be a graph characterizing a semiconductor device in a comparative example in which the charge trap layer 120 is omitted from the semiconductor device.

As described above with reference to FIG. 5A, in an initial state, the memory window V1i of the semiconductor device 1 according to an embodiment of the present disclosure may be larger than the memory window V2i of the semiconductor device of the comparative example. As the number of operation cycles of the semiconductor devices increase in the embodiment and in the comparative example, the memory window of the comparative semiconductor device illustrated by the second memory window graph 502b is significantly reduced compared to the memory window of an embodiment of the disclosure in the first memory window graph 501b. This difference in the semiconductor device of a comparative example may be due to the flow of electrons into the ferroelectric layer from the gate electrode layer through the gate insulation layer during the first write operation. The electrons may be pinned to ferroelectric domains or defect sites inside the ferroelectric layer, thereby preventing polarization switching of the ferroelectric layer. According to embodiments of the disclosure, however, charge trap layers such as charge trap layer 120 trap the electrons injected from the gate electrode layers to effectively block the electrons from moving into the ferroelectric layer. Accordingly, durability of the semiconductor device 1 according to embodiments of the present disclosure may be improved.

FIG. 5C illustrates first and second threshold voltage graphs 501c and 501d and third and fourth threshold voltage graphs 502c and 502d of semiconductor devices. The first and second threshold voltage graphs 501c and 501d may be graphs characterizing the semiconductor device 1 including the charge trap layer 120 according to embodiments of the present disclosure. The third and fourth threshold graphs 502c and 502d may be graphs characterizing a semiconductor device in a comparative example in which the charge trap layer is omitted from the comparative semiconductor device.

Referring to FIG. 5C, in the semiconductor device 1, the first write voltage V1 of FIG. 4A may be applied to the gate electrode layer 140 to write the first remanent polarization Pa of FIG. 4B in the ferroelectric layer 110. Subsequently, the threshold voltage change of the semiconductor device 1 over time may be represented by the first threshold voltage graph 501c. The threshold voltage may be affected by the change in the first remanent polarization Pa. The level of the threshold voltage along the first threshold voltage graph 501c may decrease from the initial threshold voltage V1c over time. In addition, by applying the second write voltage V2 of FIG. 4C to the gate electrode layer 140, the second remanent polarization Pb of FIG. 4D may be written in the ferroelectric layer 110. Subsequently, a change in the threshold voltage of the semiconductor device 1 over time may be represented by the second threshold voltage graph 501d. The level of the threshold voltage along the second threshold voltage graph 501d may increase from the initial threshold voltage V1d over time.

Meanwhile, in the semiconductor device according to the comparative example, a first write voltage having a negative polarity is applied to the gate electrode layer to write a first remanent polarization in the ferroelectric layer. Subsequently, a change in the threshold voltage of the semiconductor device according to the comparative example over time may be represented by the third threshold voltage graph 502c. The level of the threshold voltage along the third threshold voltage graph 502c may decrease from the initial threshold voltage V2c over time. In addition, a second write voltage having a positive polarity is applied to the gate electrode layer to write a second remanent polarization in the ferroelectric layer. Subsequently, a change in the threshold voltage of the semiconductor device according to the comparative example over time may be represented by the fourth threshold voltage graph 502d. The level of the threshold voltage along the fourth threshold voltage graph 502d may increase from the initial threshold voltage V2d over time.

Referring to FIG. 5C again, the amount of change in the threshold voltage of the semiconductor device 1 according to an embodiment of the present disclosure may be smaller than the amount of change in the threshold voltage of the semiconductor device according to the comparative example. In embodiments of the disclosure, the charge trap layer 120 suppresses or reduces the formation of a depolarization electric field inside the ferroelectric layer 110. Accordingly, polarization retention of the semiconductor device 1 according to an embodiment of the present disclosure may be improved and may result in a comparatively lower amount of change in the threshold voltage.

Figure 6:
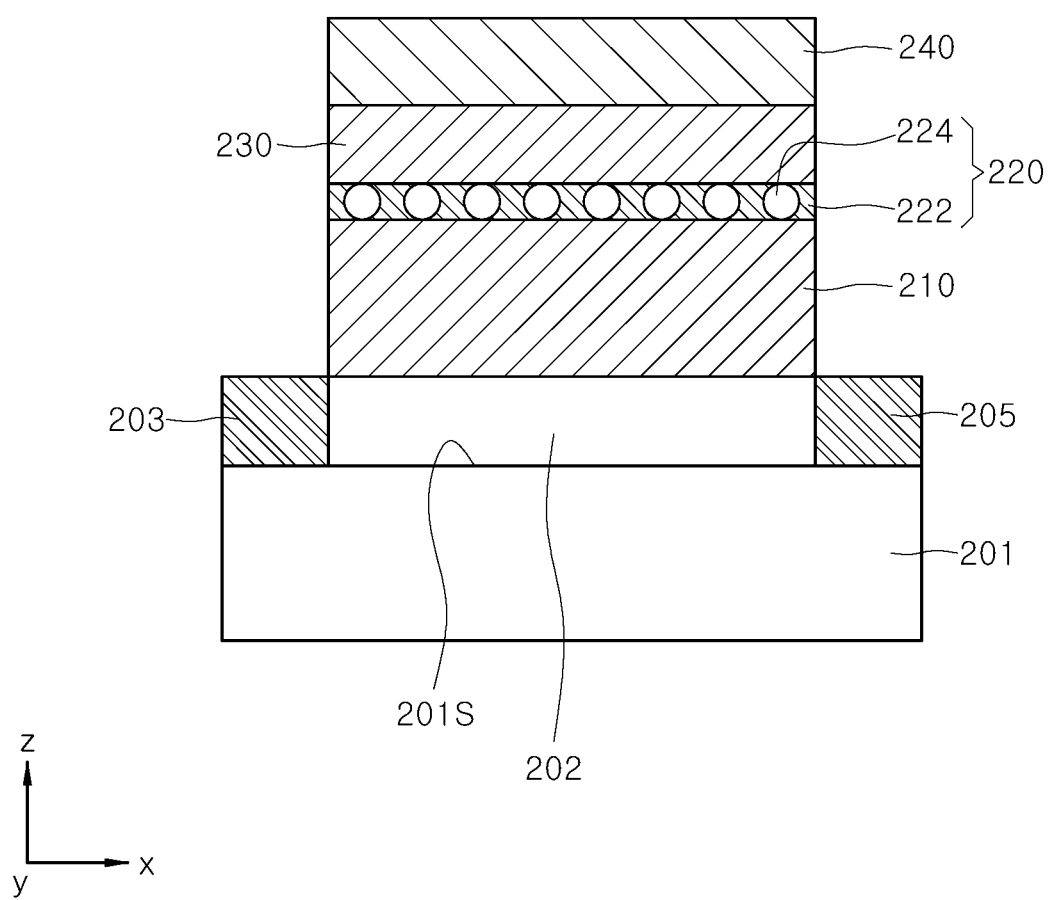
FIG. 6 is a schematic cross-sectional view illustrating a semiconductor device according to another embodiment of the present disclosure.

FIG. 6 is a schematic cross-sectional view illustrating a semiconductor device according to another embodiment of the present disclosure. Referring to FIG. 6, compared to a semiconductor device 1 of FIG. 1, a semiconductor device 2 may further include a channel layer 202 disposed between a substrate 201 and a ferroelectric layer 210. In addition, in the semiconductor device 2, a source electrode layer 203 and a drain electrode layer 205, which correspond to the source region 103 and the drain region 105, respectively, of the semiconductor device 1 may be disposed on the substrate 201.

The semiconductor device 2 may include the substrate 201, the channel layer 202 disposed on the substrate 201, the ferroelectric layer 210 disposed on the channel layer 202, a charge trap layer 220 disposed on the ferroelectric layer 210, a gate insulation layer 230 disposed on the charge trap layer 220, and a gate electrode layer 240 disposed on the gate insulation layer 230. In addition, the semiconductor device 2 may include the source electrode layer 203 and the drain electrode layer 205 disposed to respectively contact opposite ends of the channel layer 202.

The configurations of the substrate 201, the ferroelectric layer 210, the charge trap layer 220, the gate insulating layer 230, and the gate electrode layer 240 may be substantially the same as the configurations of the substrate 101, the ferroelectric layer 110, the charge trap layer 120, the gate insulation layer 130, and the gate electrode layer 140 of FIG. 1.

Referring to FIG. 6, the channel layer 202 may include a semiconductor material. The semiconductor material may include, for example, silicon (Si), germanium (Ge), gallium arsenide (GaAs), or the like. As another example, the semiconductor material may include a two-dimensional (2D) semiconductor material. The 2D semiconductor material may include transition metal dichalcogenide (TMDC) or black phosphorus. The transition metal chalcogenide may include, for example, molybdenum selenide ($MoSe_2$), hafnium selenide ($HfSe_2$), indium selenide (InSe), gallium selenide (GaSe), or the like. The semiconductor material may include, for example, metal oxide such as indium-gallium-zinc oxide (IGZO). The channel layer 202 may have conductivity. As an example, the channel layer 202 may be doped with an n-type or p-type dopant.

In FIG. 6, the channel layer 202 is disposed to contact the substrate 201, but embodiments of the present disclosure are not limited to this configuration. In some embodiments, various functional layers may be disposed between the substrate 201 and the channel layer 202. As an example, at least one conductive pattern and at least one insulation pattern may be disposed between the substrate 201 and the channel layer 202.

In FIG. 6, the channel layer 202 is disposed on a plane parallel to a surface 201S of the substrate 201, but embodiments of the present disclosure are not limited to this configuration. In some embodiments, the channel layer 202 may be disposed on a plane substantially perpendicular to the surface 201S of the substrate 201. That is, the channel layer 202 may extend in a direction substantially perpendicular to the surface 201S of the substrate 201.

The source electrode layer 203 and the drain electrode layer 205 may be respectively disposed at different or opposite ends of the channel layer 202. Each of the source electrode layer 203 and the drain electrode layer 205 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

FIGS. 7 to 11 are schematic views illustrating a method of manufacturing a semiconductor device according to an embodiment of the present disclosure. FIGS. 12A, 12B, 13A, and 13B are schematic views illustrating a method of forming a charge trap layer according to an embodiment of the present disclosure.

Figure 7:
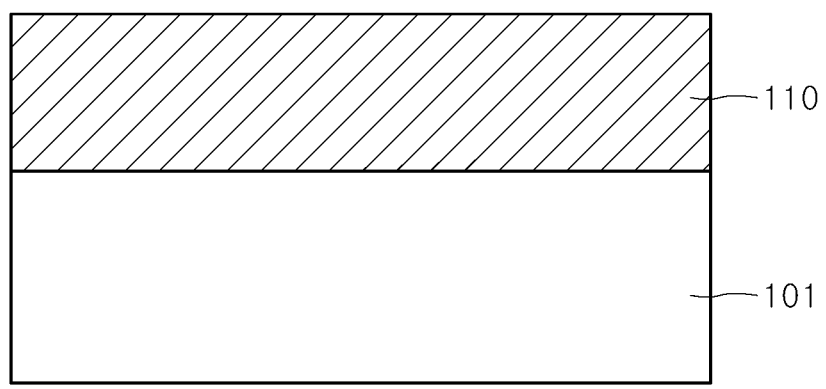
FIGS. 7 to 11 are schematic views illustrating a method of manufacturing a semiconductor device according to an embodiment of the present disclosure.

Referring to FIG. 7, a substrate 101 may be provided. The substrate 101 may include a semiconductor material. As an example, the semiconductor material may include silicon (Si), germanium (Ge), gallium arsenide (GaAs), or the like. The substrate 101 may be doped with an N-type dopant or a P-type dopant to have electrical conductivity.

Next, a ferroelectric layer 110 may be formed on the substrate 101. The ferroelectric layer 110 may include a ferroelectric material. In an embodiment, the ferroelectric layer 110 may include metal oxide, as the ferroelectric material, that has a crystalline structure of an orthorhombic system. The metal oxide may include, for example, hafnium oxide, zirconium oxide, hafnium zirconium oxide, or a combination of two or more thereof. In an embodiment, the ferroelectric layer 110 may include a dopant that is doped in the ferroelectric material. The dopant may include, for example, carbon (C), silicon (Si), magnesium (Mg), aluminum (Al), yttrium (Y), nitrogen (N), germanium (Ge), tin (Sn), strontium (Sr), lead (Pb), Calcium (Ca), barium (Ba), titanium (Ti), gadolinium (Gd), lanthanum (La), or a combination thereof.

The ferroelectric layer 110 may be formed by, for example, applying a deposition method such as a chemical vapor deposition method or an atomic layer deposition method. The dopant may be implanted into the ferroelectric layer 110 while forming the ferroelectric layer 110 using the deposition method.

Figure 8:
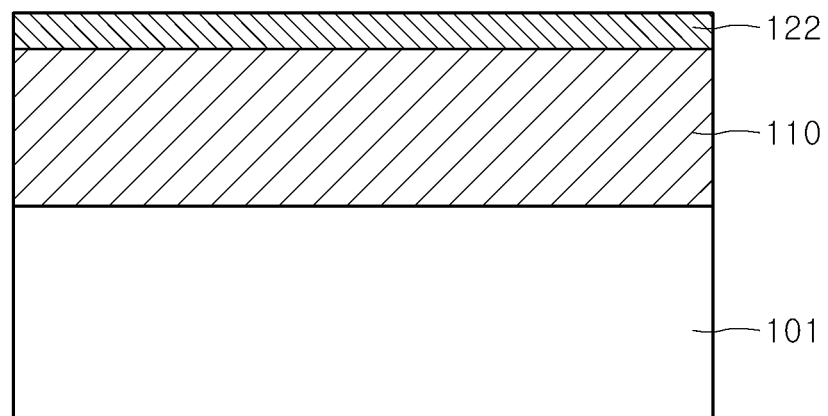
Figure 9:
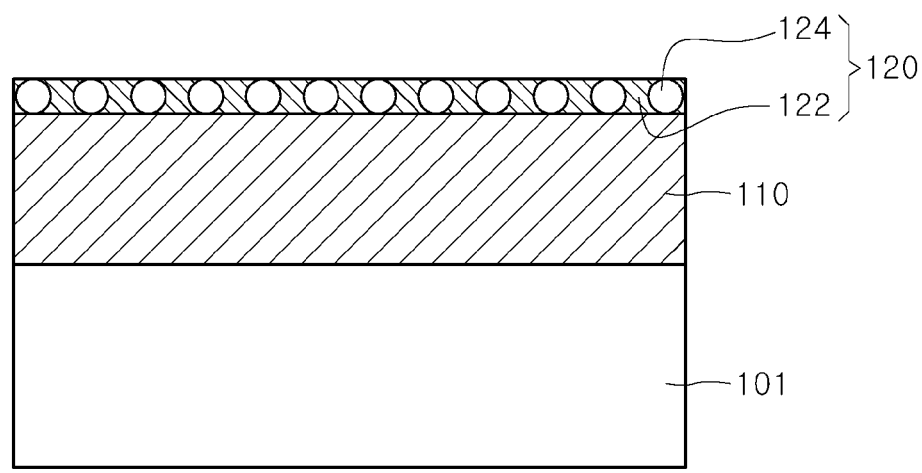
Figure 12A:
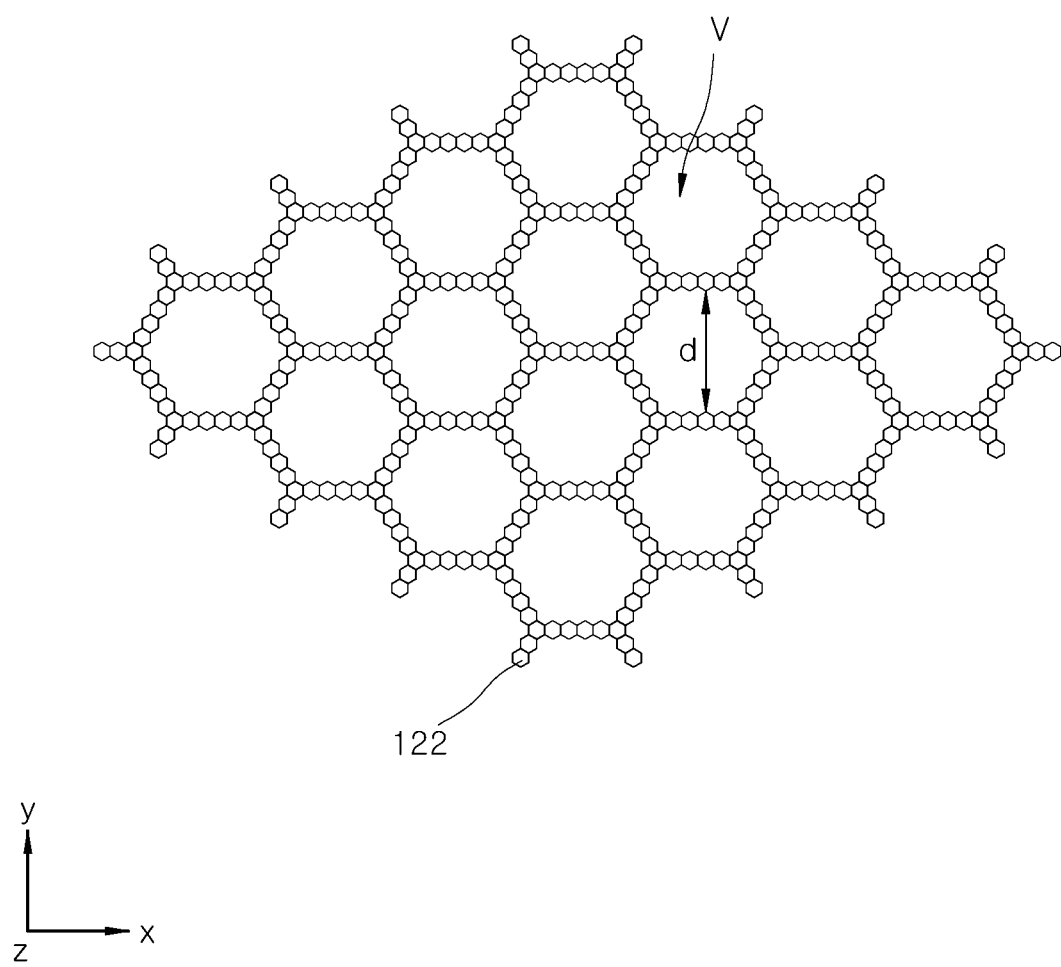
FIGS. 12A, 12B, 13A, and 13B are schematic views illustrating a method of forming a charge trap layer according to an embodiment of the present disclosure.
Figure 12B:
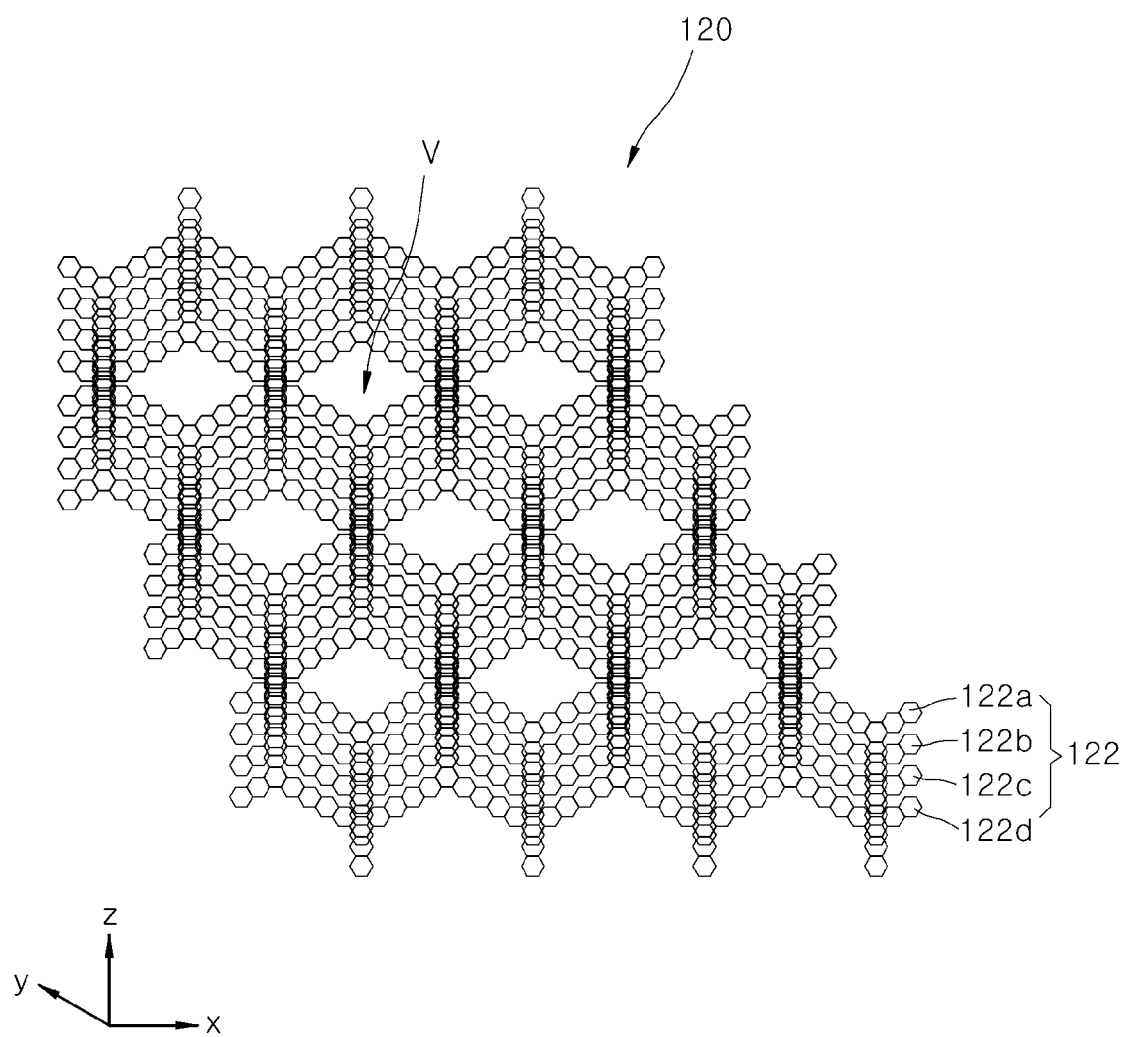

Referring to FIG. 8, a metal-organic framework layer 122 may be formed on the ferroelectric layer 110. The metal-organic framework layer 122 may be formed by sequentially stacking a plurality of conductive metal-organic frameworks 122a, 122b, 122c, and 122d having a two-dimensional structure that include cavities V, as illustrated in FIGS. 12A and 12B. The cavities V of the plurality of conductive metal-organic frameworks 122a, 122b, 122c, and 122d stacked on the ferroelectric layer 110 may overlap with each other in the z-direction. FIG. 12A is a schematic plan view of the metal-organic framework layer 122, and FIG. 12B is a schematic perspective view of the metal-organic framework layer 122.

Each of the plurality of conductive metal-organic frameworks 122a, 122b, 122c, and 122d may include a metal node and an organic ligand bonded to the metal node. In an embodiment, each of the plurality of conductive metal-organic frameworks 122a, 122b, 122c, and 122d may be the conductive metal-organic framework M1 or M2 described in connection with FIGS. 3A and 3B.

In an embodiment, the metal-organic framework layer 122 may be formed by a deposition method using a first precursor including metal constituting the metal node and a second precursor including the organic ligand. The deposition method may include, for example, an atomic layer deposition method or a chemical vapor deposition method. A first conductive metal-organic framework may be formed on the ferroelectric layer 110 by the deposition method, and then the deposition method may be used to stack a second conductive metal-organic framework on the first conductive metal-organic framework. As described above, the metal-organic framework layer 122 may be formed by sequentially stacking the conductive metal-organic frameworks using the deposition method.

In another embodiment, the process of forming the metal-organic framework layer 122 may include a process of preparing a first precursor including metal constituting the metal node and a second precursor including the organic ligand, a process of synthesizing the conductive metal-organic frameworks using the first precursor and the second precursor, and a process of coating the synthesized conductive metal-organic frameworks on the ferroelectric layer. The process of synthesizing the conductive metal-organic framework may be performed in a solution state or a vapor state.

Referring to FIGS. 12A and 12B, each of the plurality of conductive metal-organic frameworks 122a, 122b, 122c, and 122d may have a 2D structure. For example, the conductive metal-organic frameworks may be arranged in a hexagonal lattice-like structure that forms cavities V at a regular spacing or intervals. Accordingly, the shortest width d of the cavity V may be determined by materials constituting the metal node and the organic ligand. The shortest width d of the cavity V may have a size of, for example, 1 nm to 10 nm.

Figure 13A:
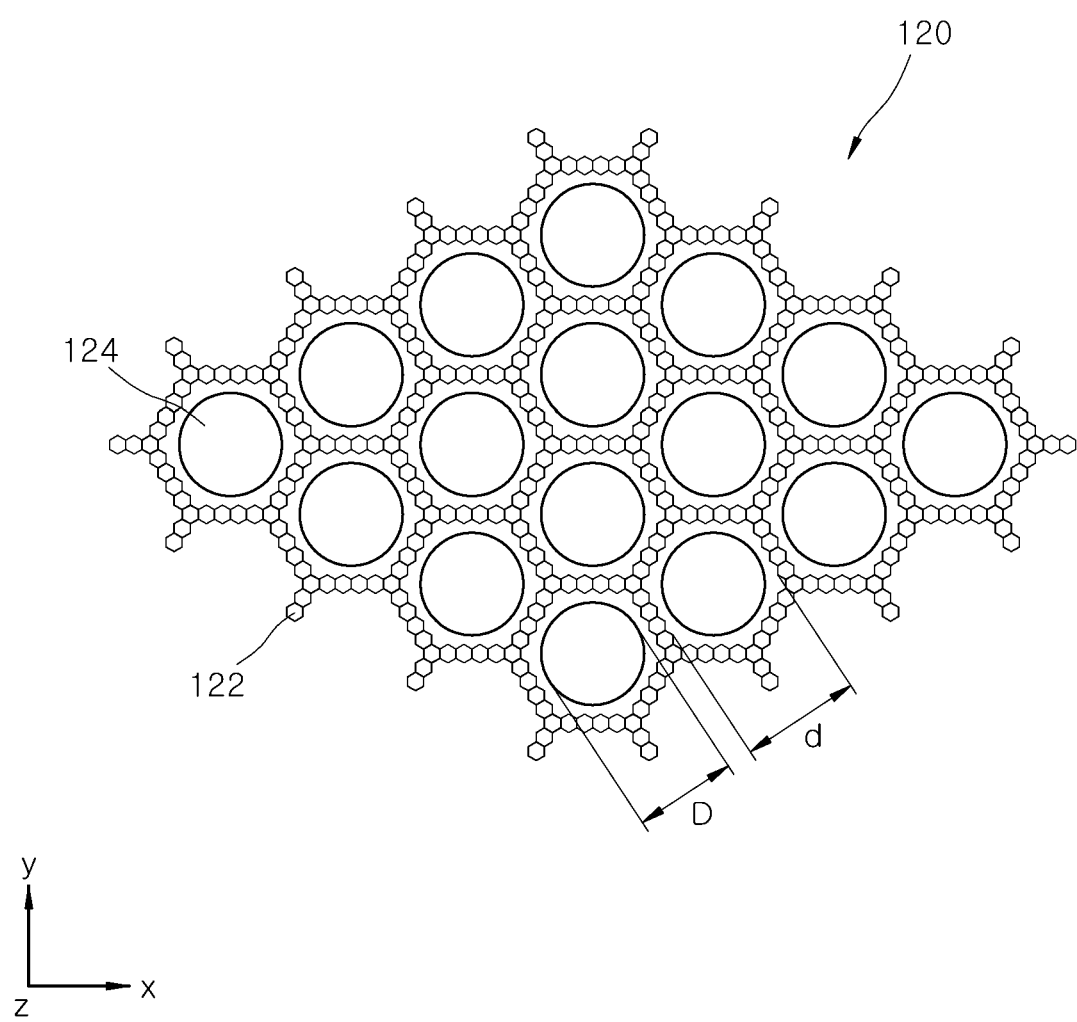
Figure 13B:
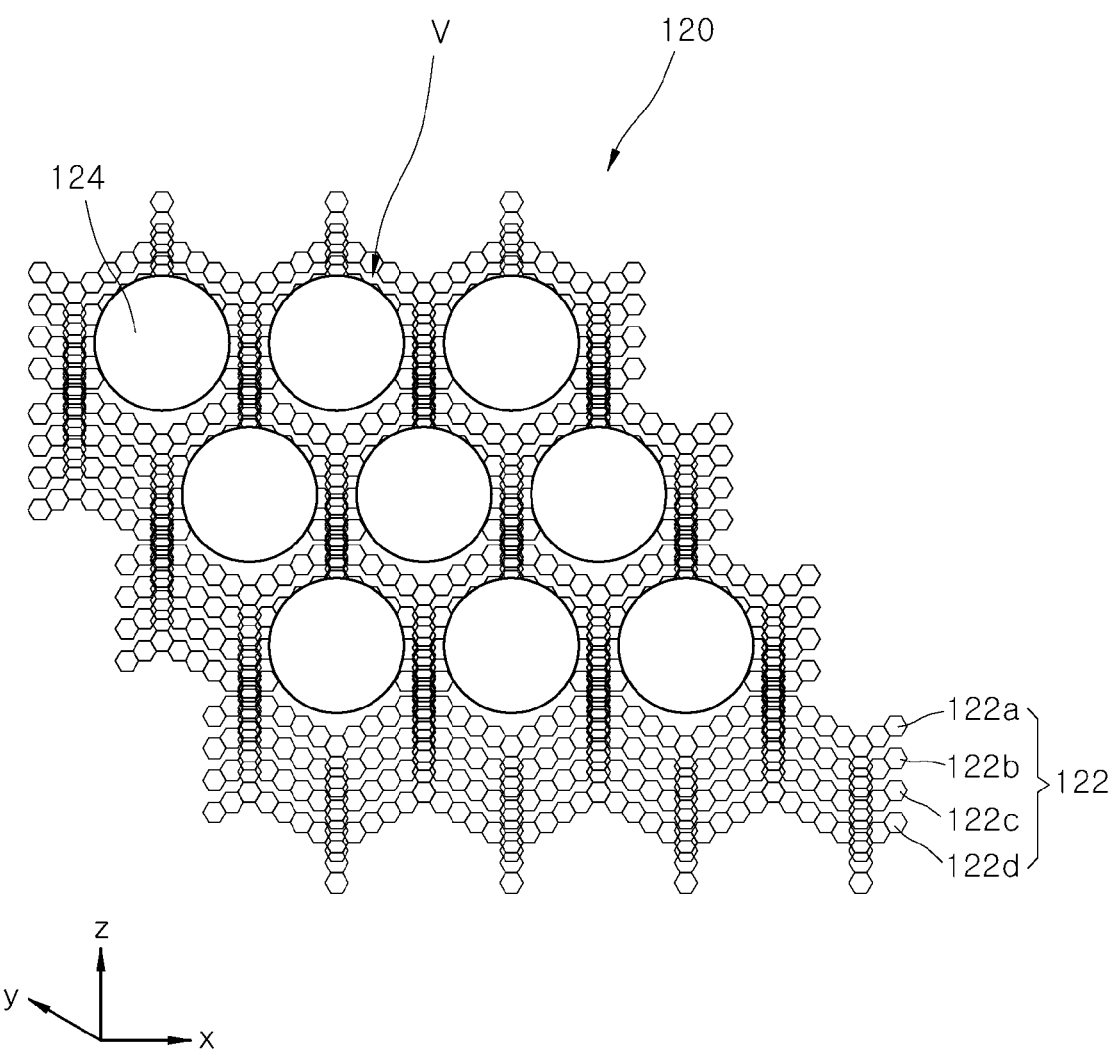

Referring to FIG. 9 again, the charge trap layer 120 may be formed by disposing the metal particles 124 in the metal-organic framework layer 122. In an embodiment, the charge trap layer 120 may be formed by forming the metal particles 124 in the inner spaces of the overlapping cavities V of the plurality of conductive metal-organic frameworks 122a, 122b, 122c, and 122d, as illustrated in FIGS. 13A and 13B. FIG. 13A is a schematic plan view of the charge trap layer 120, and FIG. 13B is a schematic perspective view of the charge trap layer 120.

In an embodiment, the process of forming the charge trap layer 120 may include a process of providing a precursor including metal to the metal-organic framework layer 122, and a process of reducing the metal of the precursor and growing the metal into the metal particles 124 in the inner spaces of the overlapping cavities V of the metal-organic framework layer 122.

In another embodiment, the process of forming the charge trap layer 120 may include a process of depositing a metal thin film to fill the inner spaces of the overlapping cavities V of the metal-organic framework layer 122 on the ferroelectric layer 110, and a process of forming the metal particles 124 by removing a portion of the metal thin film deposited outside the cavities V. The process of removing the portion of the metal thin film may be performed by, for example, polishing.

The metal particles 124 formed by the above-described methods may have a form in which metal atoms are aggregated. The metal particles 124 may have a three-dimensional shape such as, for example, a sphere. In an embodiment, the diameter D of the metal particle 124 having a spherical shape may be 1 nm to 10 nm, for example. The diameter D of the metal particle 124 may be smaller than the shortest width d of the cavity V. Accordingly, the metal particles 124 may be disposed inside the cavities V, and may be regularly arranged in the metal-organic framework layer 122. The metal particle 124 may include, for example, cobalt (Co), nickel (Ni), copper (Cu), iron (Fe), platinum (Pt), gold (Au), silver (Ag), iridium (Ir), ruthenium (Ru), palladium (Pd), manganese (Mg), or a combination of two or more thereof.

Figure 10:
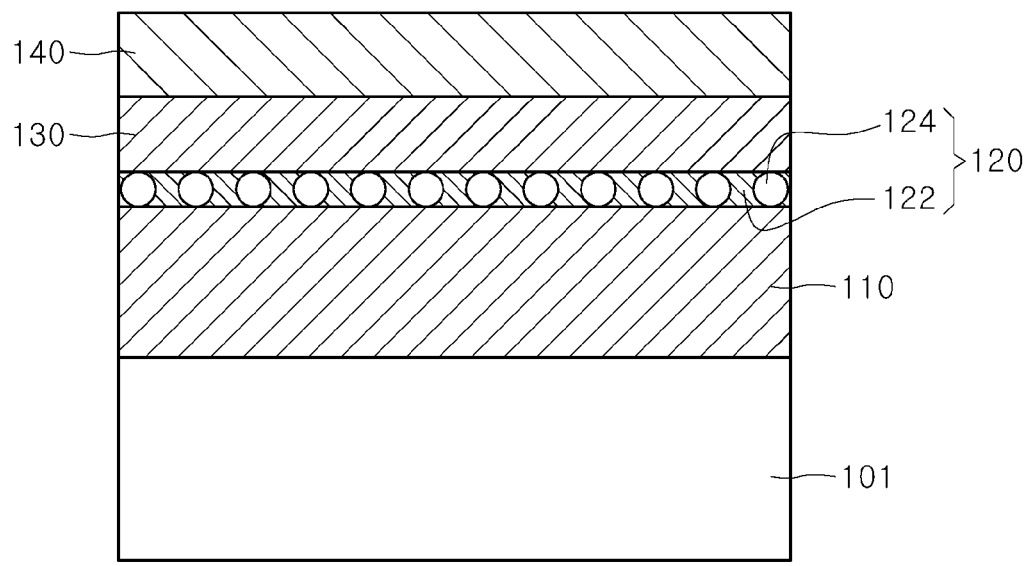

Referring to FIG. 10, the gate insulation layer 130 may be formed on the charge trap layer 120. The gate insulation layer 130 may be non-ferroelectric. The gate insulation layer 130 may include, for example, oxide, nitride, oxynitride, or a combination of two or more thereof. In an embodiment, the gate insulation layer 130 may be a silicon oxide layer, a silicon nitride layer, a silicon oxynitride layer, or an aluminum oxide layer. The gate insulation layer 130 may be formed by, for example, applying a chemical vapor deposition method, an atomic layer deposition method, or the like.

Subsequently, a gate electrode layer 140 may be formed on the gate insulation layer 130. The gate electrode layer 140 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The gate electrode layer 140 may be formed by, for example, applying a chemical vapor deposition method, an atomic layer deposition method, or the like.

Figure 11:
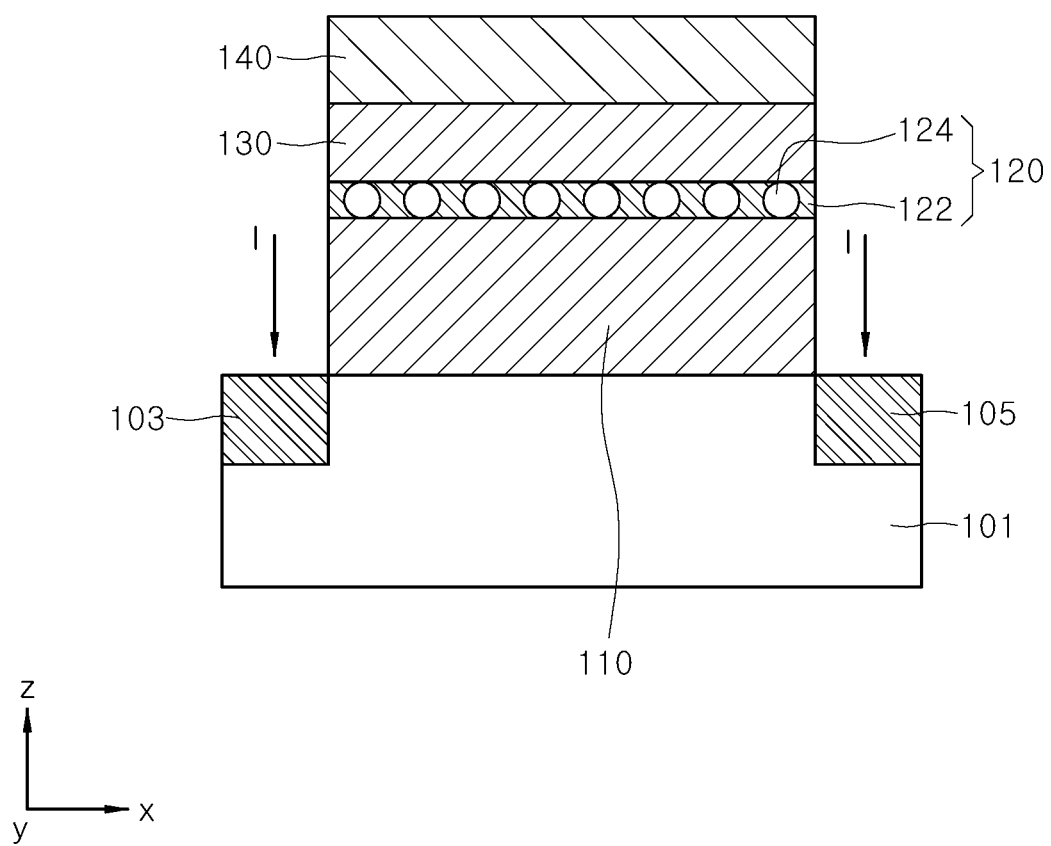

Referring to FIG. 11, the ferroelectric layer 110, the charge trap layer 120, the gate insulation layer 130, and the gate electrode layer 140 may be patterned over the substrate 101 to selectively expose the substrate 101. As a patterning process, for example, a photolithography process and an etching process may be applied.

Subsequently, a dopant I may be implanted into the exposed substrate 101 to form a source region 103 and a drain region 105. The type of the dopant used in the source region 103 and the drain region 105 may be different from that of the substrate 101. For example, when the substrate 101 is doped with a P-type dopant, the source region 103 and the drain region 105 may be doped with an N-type dopant. In another example, when the substrate 101 is doped with an N-type dopant, the source region 103 and the drain region 105 may be doped with a P-type dopant. As an example, an ion implantation method may be utilized in the dopant I implantation process.

Although not illustrated in FIGS. 7 to 11, in some embodiments, an interfacial insulation layer may further be formed between the substrate 101 and the ferroelectric layer 110. The interfacial insulation layer may function as a buffer layer for alleviating a lattice constant difference between the substrate 101 and the ferroelectric layer 110. The interfacial insulation layer may include, for example, oxide, nitride, oxynitride, or the like. The interfacial insulation layer may be formed by, for example, a chemical vapor deposition method, an atomic layer deposition method, or the like.

Through the above-described processes, semiconductor devices according to embodiments of the present disclosure may be manufactured. The above-described methods of manufacturing semiconductor devices may be used to manufacture a semiconductor device 1 of FIG. 1.

Figure 14:
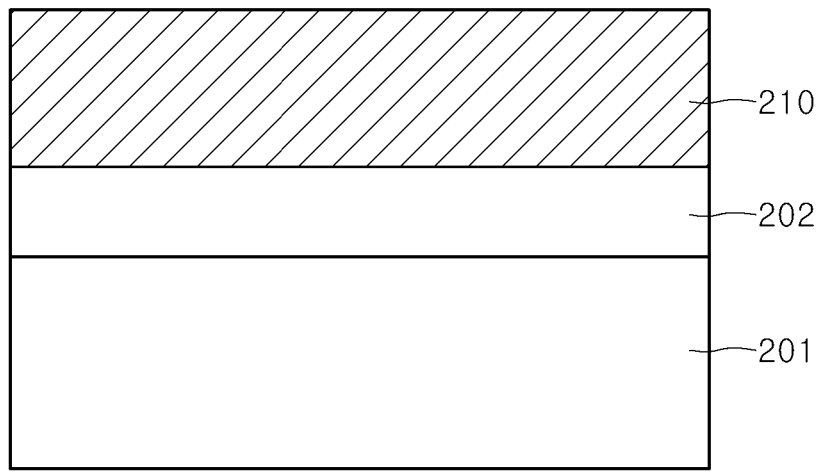
FIGS. 14 to 16 are schematic views illustrating a method of manufacturing a semiconductor device according to another embodiment of the present disclosure.
Figure 15:
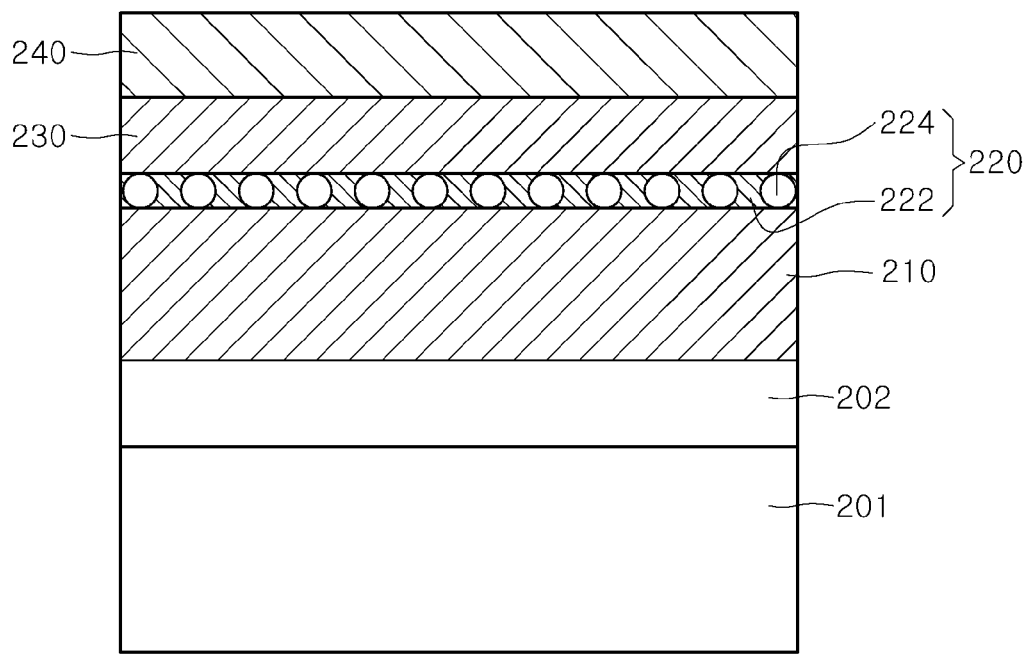
Figure 16:
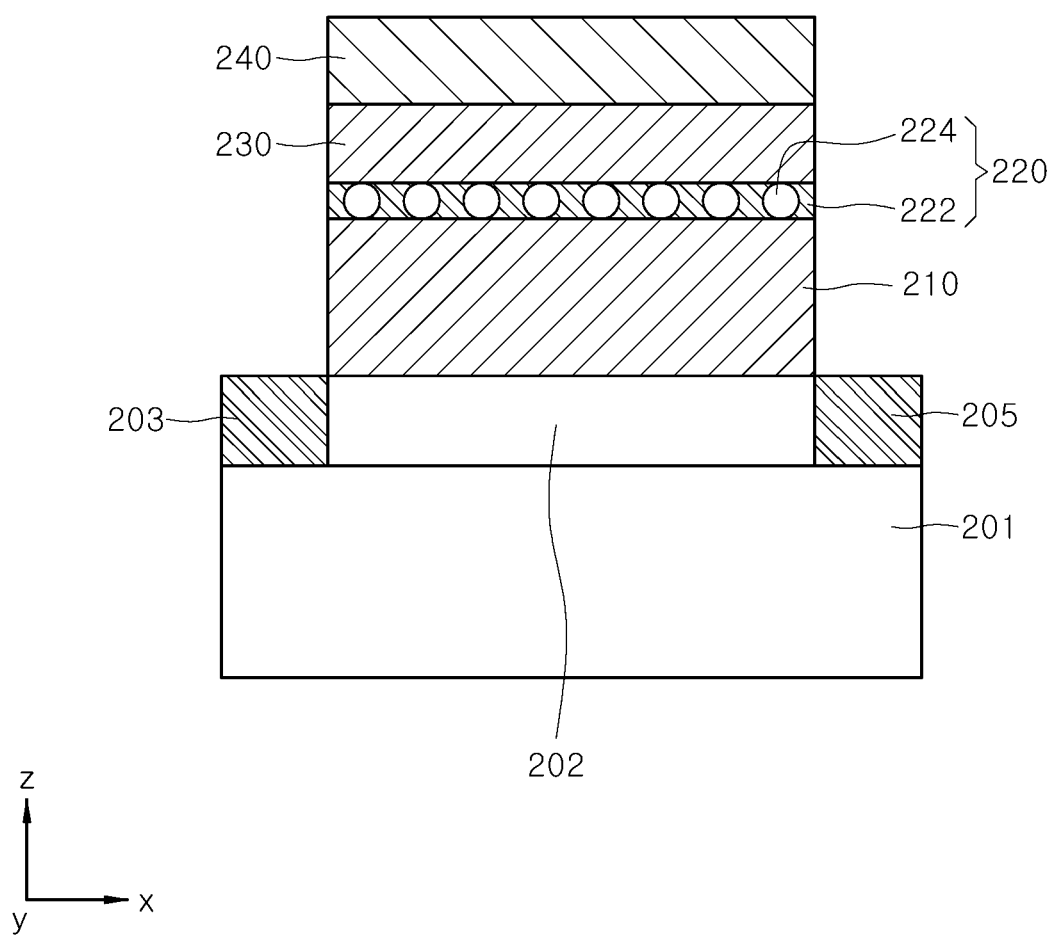

FIGS. 14 to 16 are schematic views illustrating a method of manufacturing a semiconductor device according to another embodiment of the present disclosure. The method of FIGS. 14 to 16 may be used to manufacture a semiconductor device 2 of FIG. 6.

Referring to FIG. 14, a substrate 201 may be provided. The substrate 201 may be substantially the same as the substrate 101 of FIG. 7. Alternatively, the substrate 201 may be an insulating substrate or a conductive substrate.

Next, a channel layer 202 may be formed on the substrate 201. The channel layer 202 may include a semiconductor material. The semiconductor material may include, for example, silicon (Si), germanium (Ge), gallium arsenide (GaAs), or the like. As another example, the semiconductor material may include a two-dimensional (2D) semiconductor material. The 2D semiconductor material may include transition metal dichalcogenide (TMDC) or black phosphorus. The transition metal chalcogenide may include, for example, molybdenum selenide ($MoSe_2$), hafnium selenide ($HfSe_2$), indium selenide (InSe), gallium selenide (GaSe), or the like. The semiconductor material may include, for example, metal oxide such as indium-gallium-zinc oxide (IGZO). The channel layer 202 may have conductivity. As an example, the channel layer 202 may be doped with an n-type dopant or a p-type dopant. The channel layer 202 may be formed by, for example, applying a chemical vapor deposition method, an atomic layer deposition method, or the like.

Next, a ferroelectric layer 210 may be formed on the channel layer 202. The ferroelectric layer 210 may be substantially the same as the ferroelectric layer 110 of FIG. 7. A method of forming the ferroelectric layer 210 may be substantially the same as the method of forming the ferroelectric layer 110 of FIG. 7.

Referring to FIG. 15, a charge trap layer 220, a gate insulation layer 230, and a gate electrode layer 240 may be formed on the ferroelectric layer 210. The processes of forming the charge trap layer 220, the gate insulation layer 230, and the gate electrode layer 240 may be substantially the same as the processes of forming the charge trap layer 120, the gate insulation layer 130, and the gate electrode layer 140 described above in connection with FIGS. 8 to 10.

Referring to FIG. 16, the channel layer 202, the ferroelectric layer 210, the charge trap layer 220, the gate insulation layer 230, and the gate electrode layer 240 may be patterned to selectively expose the substrate 201. The patterning process may be performed by applying, for example, a photolithography process and an etching process.

Next, a source electrode layer 203 and a drain electrode layer 205 may be formed on the exposed portions of the substrate 201. The source electrode layer 203 and the drain electrode layer 205 may be formed to respectively contact opposite ends of the channel layer 202. The source electrode layer 203 and the drain electrode layer 205 may be formed by, for example, applying a chemical vapor deposition method, an atomic layer deposition method, or the like.

Each of the source electrode layer 203 and the drain electrode layer 205 may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. Through the above-described methods, a semiconductor device according to another embodiment of the present disclosure may be manufactured.

In some embodiments, before forming the channel layer 202 in FIG. 14, at least a conductive layer and at least an insulation layer may be formed. The conductive layer and the insulation layer may form various functional layers in the semiconductor device. For example, the functional layer may include an interconnection layer.

Figure 17:
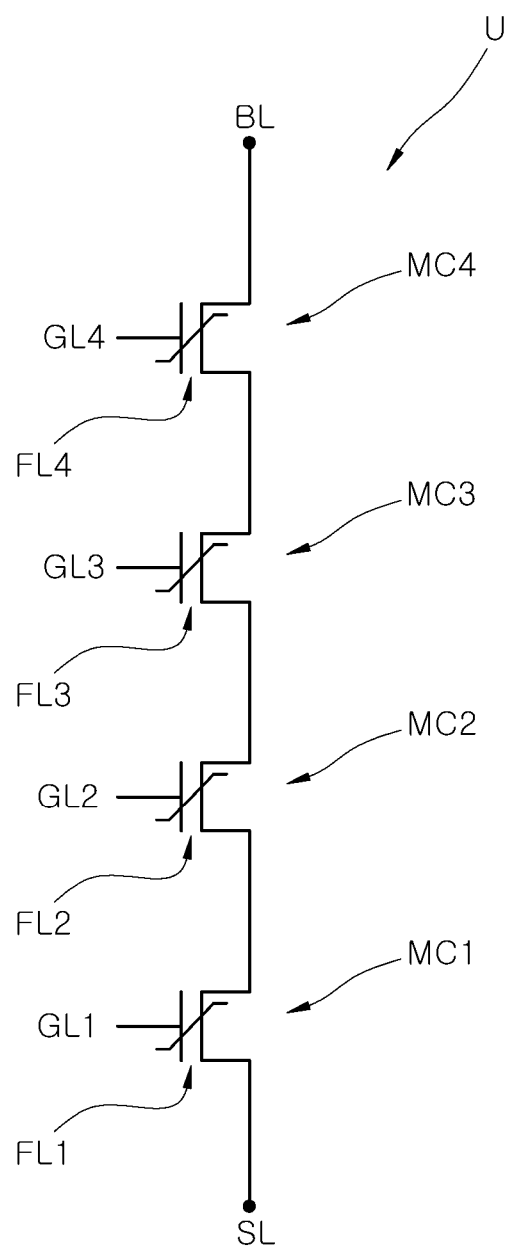
FIG. 17 is a circuit diagram of a semiconductor device according to yet another embodiment of the present disclosure.
Figure 18:
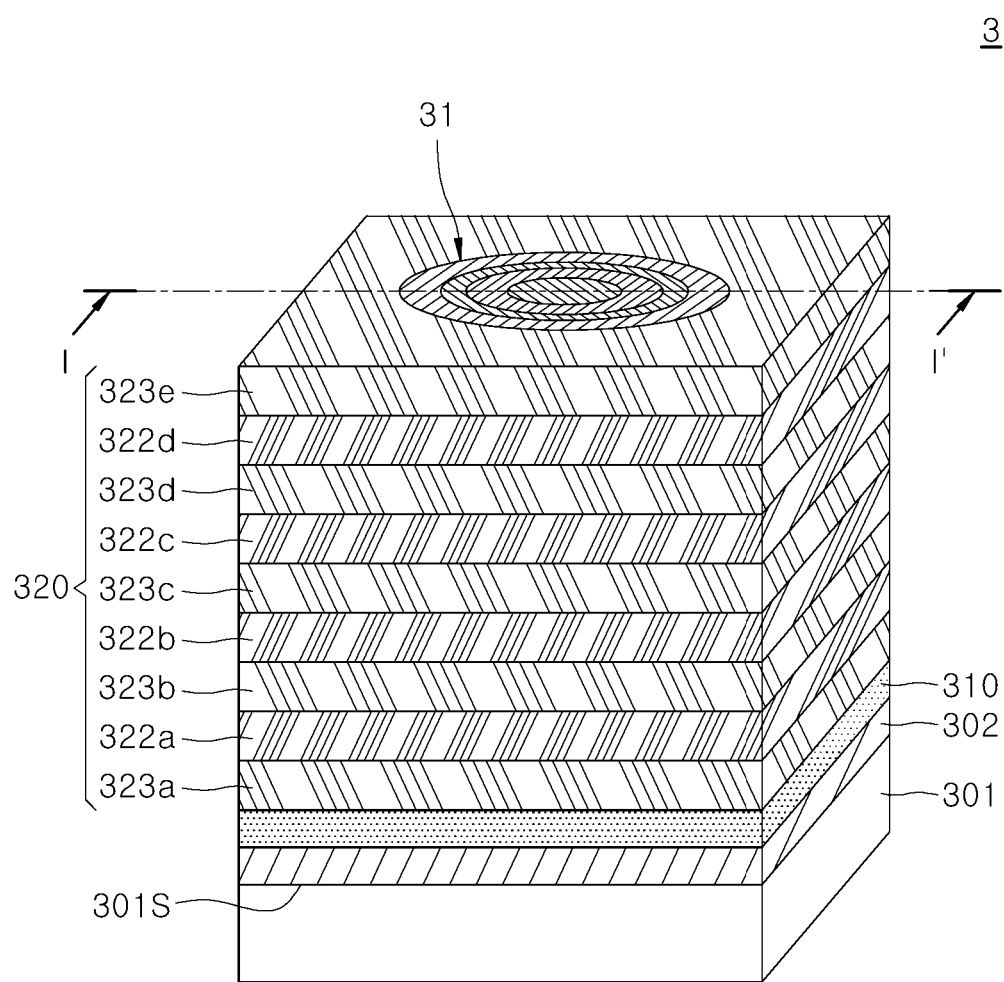
FIG. 18 is a schematic perspective view of the structure of a semiconductor device corresponding to the circuit diagram of FIG. 17.
Figure 19:
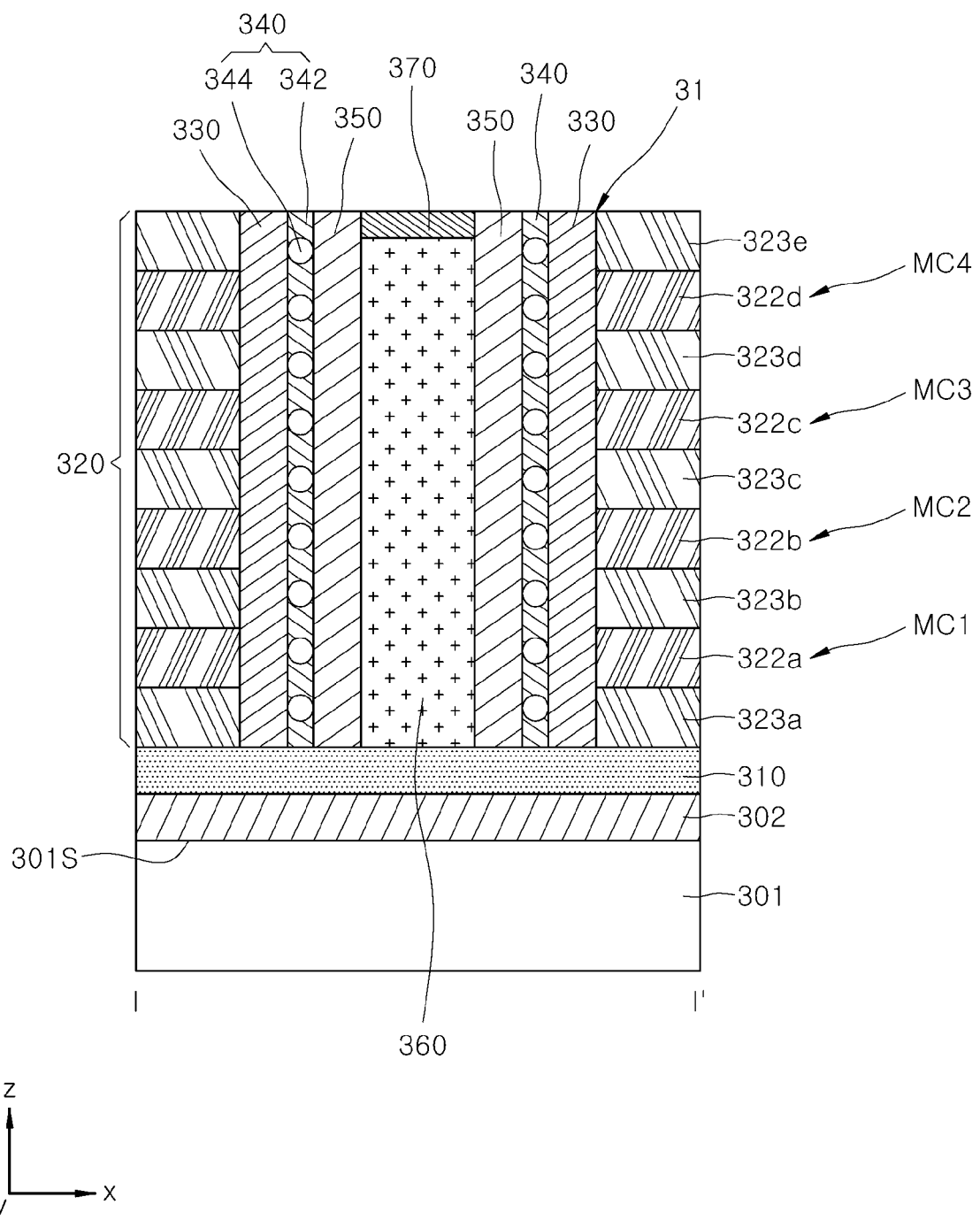
FIG. 19 is a schematic cross-sectional view of the semiconductor device of FIG. 18 taken along the line I-I'.

FIG. 17 is a circuit diagram of a semiconductor device according to yet another embodiment of the present disclosure. FIG. 18 is a schematic perspective view of the structure of a semiconductor device corresponding to the circuit diagram of FIG. 17. FIG. 19 is a schematic cross-sectional view of the semiconductor device of FIG. 18 taken along a line I-I'.

Referring to FIG. 17, a semiconductor device may include memory element units U. Each of the memory element units U may include transistor-type first to fourth memory cells MC1, MC2, MC3, and MC4. The first to fourth memory cells MC1, MC2, MC3, and MC4 may be connected in series to each other in the form of a string between a source line SL and a bit electrode BL. The memory element unit U may be a NAND type memory device in which the first to fourth memory cells MC1, MC2, MC3, and MC4 are electrically connected in series to each other.

The first to fourth memory cells MC1, MC2, MC3, and MC4 may be nonvolatile memory elements and may include first to fourth ferroelectric elements FL1, FL2, FL3, and FL4, respectively, which correspond to gate dielectric layers of the transistors. The first to fourth memory cells MC1, MC2, MC3, and MC4 may include first to fourth gate electrodes GL1, GL2, GL3, and GL4, respectively, which are connected to different word lines.

Referring to FIGS. 18 and 19, a semiconductor device 3 may include the first to fourth memory cells MC1, MC2, MC3, and MC4 each having a form of a transistor with a three dimensional structure. The semiconductor device 3 may have a circuit configuration of the memory element unit U of FIG. 17.

The semiconductor device 3 may include a substrate 301 and a gate structure 320 disposed over the substrate 301. In addition, the gate structure 320 may include a hole pattern 31. The hole pattern 31 may expose a sidewall surface of the gate structure 320. In addition, the semiconductor device 3 may include a gate insulation layer 330 disposed on the sidewall surface of the gate structure 320, a charge trap layer 340 disposed on the gate insulation layer 330, a ferroelectric layer 350 disposed on the charge trap layer 340, and a channel layer 360 disposed on the ferroelectric layer 350.

In addition, the semiconductor device 3 may include a base insulation layer 302 and a channel lower contact layer 310 disposed between the substrate 301 and the gate structure 320. The channel lower contact layer 310 may contact an end of the channel layer 360 and the base insulation layer 302. In addition, the semiconductor device 3 may include a channel upper contact layer 370 in contact with the other end of the channel layer 360.

Referring to FIGS. 18 and 19, the substrate 301 may include a semiconductor material. The base insulation layer 302 may be disposed on the substrate 301. The base insulation layer 302 may electrically insulate the channel lower contact layer 310 from the substrate 301. The base insulation layer 302 may include an insulating material. Although not illustrated, an integrated circuit may be disposed between the substrate 301 and the base insulation layer 302. The integrated circuit may include a circuit for driving and controlling a plurality of memory cells of the semiconductor device 3.

The channel lower contact layer 310 may be disposed on the base insulation layer 302. The channel lower contact layer 310 may be electrically connected to the channel layer 360. Although not illustrated, the channel lower contact layer 310 may be electrically connected to a source line. The channel lower contact layer 310 may include a conductive material.

The gate structure 320 may be disposed on the channel lower contact layer 310. The gate structure 320 may include first to fourth gate electrode layers 322a, 322b, 322c, and 322d and first to fifth interlayer insulation layers 323a, 323b, 323c, 323d, and 323e, which are alternately stacked along a first direction (i.e., z-direction) perpendicular to a surface 301S of the substrate 301. The first interlayer insulation layer 323a may be disposed to contact the channel lower contact layer 310. The fifth interlayer insulation layer 323e may be disposed as an uppermost layer of the gate structure 320. Each of the first to fourth gate electrode layers 322a, 322b, 322c, and 322d may include a conductive material. Each of the first to fifth interlayer insulation layers 323a, 323b, 323c, 323d, and 323e may include an insulating material.

The number of gate electrode layers of the gate structure 320 might not necessarily be limited to four as shown in FIGS. 18 and 19. In other embodiments, the gate electrode layers may be disposed in different numbers, and the interlayer insulation layer may insulate the various numbers of gate electrode layers from each other in the first direction (i.e., z-direction).

Referring to FIGS. 18 and 19, the hole pattern 31 may be formed to penetrate the gate structure 320 and to expose the channel lower contact layer 310. The hole pattern 31 may be formed, for example, by a photolithography and etching process.

The gate insulation layer 330 may be disposed to cover the sidewall surface of the gate structure 320 inside the hole pattern 31. The gate insulation layer 330 may include an insulating material. The configuration of the gate insulation layer 330 material may be substantially the same as the configuration of the gate insulation layer 130 material of the semiconductor device 1 described above with reference to FIGS. 1, 2A, and 2B.

The charge trap layer 340 may be disposed on a sidewall surface of the gate insulation layer 330. The charge trap layer 340 may include a metal-organic framework layer 342 and metal particles 344 embedded in the metal-organic framework layer 342.

The diameter of the metal particle 344 may be substantially the same as the thickness of the metal-organic framework layer 342. Accordingly, the metal particles 344 may penetrate or extend through the metal-organic framework layer 342 to contact the gate insulation layer 330 and the ferroelectric layer 350. The configurations of the metal-organic framework layer 342 and the metal particles 344 may be substantially the same as those of the metal-organic framework layer 122 and the metal particles 124 of the semiconductor device 1 described above with reference to FIGS. 1, 2A, and 2B.

The ferroelectric layer 350 may be disposed on a sidewall surface of the charge trap layer 340. The configuration of the ferroelectric layer 350 may be substantially the same as that of the ferroelectric layer 110 of the semiconductor device 1 described above with reference to FIGS. 1, 2A, and 2B.

The channel layer 360 may be disposed to contact the ferroelectric layer 350. The channel layer 360 may extend inside the hole pattern 31 in a direction substantially perpendicular to the surface 301S of the substrate 301, such as for example, in the z-direction. The channel layer 360 may include a semiconductor material. The channel layer 360 may be doped with a dopant and may have electrical conductivity. The configuration of the channel layer 360 may be substantially the same as that of the channel layer 202 of the semiconductor device 2 described with reference to FIG. 6.

Referring to FIGS. 18 and 19, the channel upper contact layer 370 may be disposed on the channel layer 360. The channel upper contact layer 370 may be electrically connected to a bit line (not shown). The channel upper contact layer 370 may include a conductive material. The channel upper contact layer 370 may be made of the same material as the channel lower contact layer 310.

As described above, the semiconductor device 3 may have a device structure corresponding to the circuit configuration of the memory device unit U of FIG. 17. As an example, the first memory cell MC1 may include a first gate electrode layer 322a, a portion of the gate insulation layer 330 electrically controlled by the first gate electrode layer 322a, a portion of the charge trap layer 340 electrically controlled by the first gate electrode layer 322a, a portion of the ferroelectric layer 350 electrically controlled by the first gate electrode layer 322a, and a portion of the channel layer 360 electrically controlled by the first gate electrode layer 322a. As another example, the second memory cell MC2 may include a second gate electrode layer 322b, a portion of the gate insulation layer electrically controlled by the second electrode layer 322b, a portion of the charge trap layer 340 electrically controlled by the second gate electrode layer 322b, a portion of the ferroelectric layer 350 electrically controlled by the second electrode layer 322b, and a portion of the channel layer 360 electrically controlled by the second gate electrode layer 322b. As another example, the third memory cell MC3 may include a third gate electrode layer 322c, a portion of the gate insulation layer 330 electrically controlled by the third gate electrode layer 322c, a portion of the charge trap layer 340 electrically controlled by the third gate electrode layer 322c, a portion of the ferroelectric layer 350 electrically controlled by the third electrode layer 322c, and a portion of the channel layer 360 electrically controlled by the third gate electrode layer 322c. As further another example, the fourth memory cell MC4 may include a fourth gate electrode layer 322d, a portion of the gate insulation layer 330 electrically controlled by the fourth gate electrode layer 322d, a portion of the charge trap layer 340 electrically controlled by the fourth gate electrode layer 322d, a portion of the ferroelectric layer 350 electrically controlled by the fourth electrode layer 322d, and a portion of the channel layer 360 electrically controlled by the fourth gate electrode layer 322d.

As described above, according to embodiments of the present disclosure, semiconductor devices including a charge trap layer disposed between a ferroelectric layer and a gate insulation layer may be implemented in various forms. The charge trap layer may include a metal-organic framework layer in which metal particles are embedded.

The charge trap layer may prevent a depolarization electric field from being formed in the ferroelectric layer, and may increase the operation voltage range of the semiconductor device, that is, the memory operation window, through electron trapping and de-trapping operations. In addition, durability and polarization retention of the semiconductor device may be improved. As a result, the operating performance of the ferroelectric semiconductor device may be improved.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising;
a substrate;
a ferroelectric layer disposed on the substrate;
a charge trap layer disposed on the ferroelectric layer;
a gate insulation layer disposed on the charge trap layer; and
a gate electrode layer disposed on the gate insulation layer,
wherein the charge trap layer includes a metal-organic framework layer and metal particles embedded in the metal-organic framework layer.

2. The semiconductor device of claim 1, further comprising a source region and a drain region respectively disposed in different regions of the substrate.

3. The semiconductor device of claim 1, wherein the ferroelectric layer includes at least one selected from hafnium oxide, zirconium oxide, and hafnium zirconium oxide.

4. The semiconductor device of claim 1, wherein the metal-organic framework layer includes a two-dimensional conductive metal-organic framework that includes cavities.

5. The semiconductor device of claim 4,
wherein the metal-organic framework layer includes at least two conductive metal-organic frameworks stacked on the ferroelectric layer,
wherein the cavities of the at least two conductive metal-organic frameworks are disposed to overlap with each other in a thickness direction of the metal-organic framework layer, and
wherein the metal particles are disposed inside the overlapping cavities.

6. The semiconductor device of claim 4, wherein the conductive metal-organic framework includes at least one selected from hexahydroxytriphenylene, hexaiminotriphenylene, hexathioltriphenylene, hexahydrobenzene, hexaaminobenzene, and hexathiolbenzene.

7. The semiconductor device of claim 1, wherein the metal particle includes at least one selected from cobalt (Co), nickel (Ni), copper (Cu), iron (Fe), platinum (Pt), gold (Au), silver (Ag), iridium (Ir), ruthenium (Ru), palladium (Pd), and manganese (Mg).

8. The semiconductor device of claim 1, wherein the metal particles are configured to trap or de-trap electric charges depending on a polarity of a voltage applied between the gate electrode layer and the substrate.

9. The semiconductor device of claim 1, wherein the metal particles are regularly arranged in the metal-organic framework layer.

10. A semiconductor device comprising:
a substrate;
a channel layer disposed over the substrate in a vertical direction;
a ferroelectric layer disposed on the channel layer;
a charge trap layer disposed on the ferroelectric layer;
a gate insulation layer disposed on the charge trap layer;
a gate electrode layer disposed on the gate insulation layer; and
a source electrode layer and a drain electrode layer disposed to respectively contact opposite ends of the channel layer over the substrate,
wherein the charge trap layer includes a metal-organic framework layer and metal particles embedded in the metal-organic framework layer.

11. The semiconductor device of claim 10, wherein the channel layer includes a semiconductor material.

12. The semiconductor device of claim 10, wherein the metal-organic framework layer includes two-dimensional conductive metal-organic frameworks that include cavities.

13. The semiconductor device of claim 12,
wherein the metal-organic framework layer includes at least two conductive metal-organic frameworks stacked on the ferroelectric layer,
wherein the cavities of the at least two conductive metal-organic frameworks are disposed to overlap with each other in a thickness direction of the metal-organic framework layer, and
wherein the metal particles are disposed in interior spaces of the overlapping cavities.

14. A semiconductor device comprising:
a substrate;
a gate structure including a hole pattern over the substrate, the gate structure including gate electrode layers and interlayer insulation layers, which are alternately stacked over the substrate;
a gate insulation layer disposed on a sidewall surface of the gate structure exposed by the hole pattern;
a charge trap layer disposed on the gate insulation layer;
a ferroelectric layer disposed on the charge trap layer; and
a channel layer disposed on the ferroelectric layer,
wherein the charge trap layer includes a metal-organic framework layer and metal particles embedded in the metal-organic framework layer.

15. The semiconductor device of claim 14, wherein the channel layer extends in a direction substantially perpendicular to a surface of the substrate.

16. The semiconductor device of claim 14, further comprising a source line and a bit line electrically connected to opposite ends of the channel layer, respectively.

17. The semiconductor device of claim 14, wherein the metal-organic framework layer includes two-dimensional conductive metal-organic frameworks that form cavities.

18. The semiconductor device of claim 17,
wherein the metal-organic framework layer includes at least two conductive metal-organic frameworks stacked over the gate insulation layer,
wherein the cavities of the at least two conductive metal-organic frameworks are disposed to overlap with each other in a thickness direction of the metal-organic framework layer, and
wherein the metal particles are disposed inside the overlapping cavities.

19. The semiconductor device of claim 14, wherein the conductive metal-organic framework includes at least one selected from hexahydroxytriphenylene, hexaiminotriphenylene, hexathioltriphenylene, hexahydrobenzene, hexaaminobenzene, and hexathiolbenzene.

20. The semiconductor device of claim 14, wherein the metal particle includes at least one selected from cobalt (Co), nickel (Ni), copper (Cu), iron (Fe), platinum (Pt), gold (Au), silver (Ag), iridium (Ir), ruthenium (Ru), palladium (Pd), and manganese (Mg).

* * * * *